(12) United States Patent
Seo et al.

(10) Patent No.: US 11,715,525 B2
(45) Date of Patent: Aug. 1, 2023

(54) ERASE METHOD OF NONVOLATILE MEMORY DEVICE, AND OPERATION METHOD OF STORAGE DEVICE

(71) Applicant: Samsung Electronics Co., Ltd., Suwon-si (KR)

(72) Inventors: Jun-Ho Seo, Hwaseong-si (KR); Yong-Lae Kim, Hwaseong-si (KR); Haneol Jang, Hwaseong-si (KR); Hyukje Kwon, Seoul (KR); Sang-Wan Nam, Hwaseong-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 150 days.

(21) Appl. No.: 17/408,921

(22) Filed: Aug. 23, 2021

(65) Prior Publication Data

US 2022/0059168 A1   Feb. 24, 2022

(30) Foreign Application Priority Data

Aug. 24, 2020  (KR) .................. 10-2020-0106060
Nov. 2, 2020   (KR) .................. 10-2020-0144544

(51) Int. Cl.
| | |
|---|---|
| *G11C 16/10* | (2006.01) |
| *G11C 16/14* | (2006.01) |
| *G11C 16/04* | (2006.01) |
| *G11C 16/08* | (2006.01) |
| *G11C 16/24* | (2006.01) |
| *G11C 16/26* | (2006.01) |
| *G11C 16/34* | (2006.01) |
| *H10B 43/27* | (2023.01) |

(52) U.S. Cl.
CPC .......... *G11C 16/14* (2013.01); *G11C 16/0483* (2013.01); *G11C 16/08* (2013.01); *G11C 16/24* (2013.01); *G11C 16/26* (2013.01); *G11C 16/3445* (2013.01); *G11C 16/10* (2013.01); *H10B 43/27* (2023.02)

(58) Field of Classification Search
CPC ...................................................... G11C 7/14
USPC ...................................................... 365/210.1
See application file for complete search history.

(56) References Cited

U.S. PATENT DOCUMENTS

| 5,931,563 A | 8/1999 | Jinbo |
|---|---|---|
| 6,967,874 B2 | 11/2005 | Hosono |

(Continued)

FOREIGN PATENT DOCUMENTS

| KR | 1020180057260 A | 5/2018 |
|---|---|---|
| KR | 1020190074449 A | 6/2019 |

*Primary Examiner* — Jason Lappas
(74) *Attorney, Agent, or Firm* — Muir Patent Law, PLLC

(57) ABSTRACT

A nonvolatile memory device includes a memory block including a first structure formed on a substrate and a second structure formed on the first structure. An erase method of the nonvolatile memory device includes applying a word line erase voltage to first normal word lines of the first structure and second normal word lines of the second structure, and applying a junction word line erase voltage smaller than the word line erase voltage to at least one of a first junction word line of the first structure and a second junction word line of the second structure. The first junction word line is a word line adjacent to the second structure from among word lines of the first structure, and the second junction word line is a word line adjacent to the first structure from among word lines of the second structure.

20 Claims, 26 Drawing Sheets

(56) References Cited

U.S. PATENT DOCUMENTS

| | | | |
|---|---|---|---|
| 7,397,706 | B2 | 7/2008 | Byeon et al. |
| 7,778,086 | B2 | 8/2010 | Yu et al. |
| 7,864,582 | B2 | 1/2011 | Lee et al. |
| 8,259,499 | B2 | 9/2012 | Chang et al. |
| 8,976,597 | B2 | 3/2015 | Shiino et al. |
| 9,530,517 | B2 | 12/2016 | Lee et al. |
| 9,620,217 | B2 | 4/2017 | Lue et al. |
| 10,600,487 | B2 | 3/2020 | Nam et al. |
| 2008/0117691 | A1 | 5/2008 | Kawasaki |
| 2008/0158998 | A1 | 7/2008 | Choi |
| 2013/0314995 | A1 | 11/2013 | Dutta et al. |
| 2018/0144802 | A1 | 5/2018 | Choi et al. |
| 2019/0171381 | A1* | 6/2019 | Ioannou ................ G06F 3/0679 |
| 2019/0189632 | A1 | 6/2019 | Lee et al. |

\* cited by examiner

[ERS operation on NWL]

[1st ERS operation on CWL+NWL]

[2nd ERS operation on CWL2+NWL]

[4th ERS operation on CWL2+NWL]

[ERS operation on CWL]

FIG. 22

| | [CASE 1] | [CASE 2] |
|---|---|---|
| WL8 | [1] WL8 PGM | [1] WL8 PGM |
| WL7 | [2] WL7 PGM | [2] WL7 PGM |
| WL6 | [3] WL6 PGM | [3] WL6 PGM |
| WL5 | [4] WL5 PGM | [4] WL5 PGM |
| CWL2 | [9] CWL1/CWL2 ERS | [5] CWL1/CWL2 ERS |
| CWL1 | | |
| WL4 | [5] WL4 PGM | [6] WL4 PGM |
| WL3 | [6] WL3 PGM | [7] WL3 PGM |
| WL2 | [7] WL2 PGM | [8] WL2 PGM |
| WL1 | [8] WL1 PGM | [9] WL1 PGM |

ERASE METHOD OF NONVOLATILE MEMORY DEVICE, AND OPERATION METHOD OF STORAGE DEVICE

CROSS-REFERENCE TO RELATED APPLICATIONS

This application claims priority under 35 U.S.C. § 119 to Korean Patent Application Nos. 10-2020-0106060 filed on Aug. 24, 2020 and 10-2020-0144544 filed on Nov. 2, 2020, in the Korean Intellectual Property Office, the disclosures of which are incorporated by reference herein in their entireties.

BACKGROUND

Embodiments of the present disclosure described herein relate to a semiconductor memory, and more particularly, relate to an erase method of a nonvolatile semiconductor memory and an operation method of a storage device.

A semiconductor memory is classified as a volatile memory, in which stored data disappear when a power is turned off, such as a static random access memory (SRAM) or a dynamic random access memory (DRAM), or a nonvolatile memory, in which stored data are retained even when a power is turned off, such as a flash memory, a phase-change RAM (PRAM), a magnetic RAM (MRAM), a resistive RAM (RRAM), or a ferroelectric RAM (FRAM). Nowadays, a technology for stacking memory cells in a three-dimensional structure is being developed to make the degree of integration of the nonvolatile memory device high. However, it is desired to improve an erase deterioration in the stacking memory cells of the three-dimensional structure.

SUMMARY

Embodiments of the present disclosure provide an erase method of a nonvolatile memory device having improved reliability by making a characteristic of a word line at a junction of a multi-stacked memory structure better and an operation method of a storage device.

According to an embodiment, a nonvolatile memory device includes a memory block including a first structure formed on a substrate and a second structure formed on the first structure. The first structure including a plurality of first word lines connected to first normal cells and a first junction memory cell, and the second structure including a plurality of second word lines connected to second normal cells and a second junction memory cell. An erase method of the nonvolatile memory device includes applying a word line erase voltage to first normal word lines of the plurality of first word lines connected to the first normal cells of the first structure and second normal word lines of the plurality of second word lines connected to the second normal cells of the second structure during a word line setup phase, and applying a junction word line erase voltage smaller than the word line erase voltage to at least one of a first junction word line of the plurality of first word lines connected to the first junction memory cell of the first structure and a second junction word line of the plurality of second word lines connected to the second junction memory cell of the second structure during the word line setup phase. The first junction word line is a word line adjacent to the second structure from among the plurality of first word lines, and the second junction word line is a word line adjacent to the first structure from among the plurality of second word lines.

According to an embodiment, a nonvolatile memory device includes a memory block including a first structure formed on a substrate and a second structure formed on the first structure. The first structure including a plurality of first word lines connected to first normal cells and a first junction memory cell, and the second structure including a plurality of second word lines connected to second normal cells and a second junction memory cell. An erase method of the nonvolatile memory device includes applying an erase voltage to a common source line connected to the first structure during a word line setup phase, applying a junction word line erase voltage smaller than the erase voltage to at least one of a first junction word line of the plurality of first word lines connected to the first junction memory cell of the first structure and a second junction word line of the plurality of second word lines connected to the second junction memory cell of the second structure during the word line setup phase, and increasing the junction word line erase voltage to a first voltage and applying the increased voltage to the at least one of the first junction word line and the second junction word line during an erase phase following the word line setup phase. The first junction word line is a word line adjacent to the second structure from among the plurality of first word lines, and the second junction word line is a word line adjacent to the first structure from among the plurality of second word lines.

According to an embodiment, an operation method of a storage device which includes a nonvolatile memory device and a memory controller, the nonvolatile memory device including a memory block which includes a first structure formed on a substrate and a second structure formed on the first structure, the first structure including a plurality of first word lines connected to first normal cells and a first junction memory cell, and the second structure including a plurality of second word lines connected to second normal cells and a second junction memory cell, the operation method includes transmitting, at the memory controller, a first command and a first address to the nonvolatile memory device, performing, at the nonvolatile memory device, a first read operation on a memory block corresponding to the first address in response to the first command to output a first counting value, transmitting, at the memory controller, a first erase command and the first address to the nonvolatile memory device when the first counting value is greater than a reference value, and performing, at the nonvolatile memory device, a first erase operation on the memory block corresponding to the first address in response to the first erase command. The first erase operation includes applying a word line erase voltage to first normal word lines of the plurality of first word lines connected to the first normal cells of the first structure and second normal word lines of the plurality of second word lines connected to the second normal cells of the second structure during a word line setup phase, and applying a junction word line erase voltage smaller than the word line erase voltage to at least one of a first junction word line of the first structure and a second junction word line of the plurality of second word lines connected to the second junction memory cell of the second structure during the word line setup phase. The first junction word line is a word line adjacent to the second structure from among the plurality of first word lines, and the second junction word line is a word line adjacent to the first structure from among the plurality of second word lines.

BRIEF DESCRIPTION OF THE FIGURES

The above and other objects and features of the present disclosure will become apparent by describing in detail exemplary embodiments thereof with reference to the accompanying drawings.

FIG. 22 is a diagram for describing an operation according to the flowchart of FIG. 21 according to example embodiments.

DETAILED DESCRIPTION

Below, embodiments of the present disclosure may be described in detail and clearly to such an extent that an ordinary one in the art easily implements the present disclosure.

Figure 1:
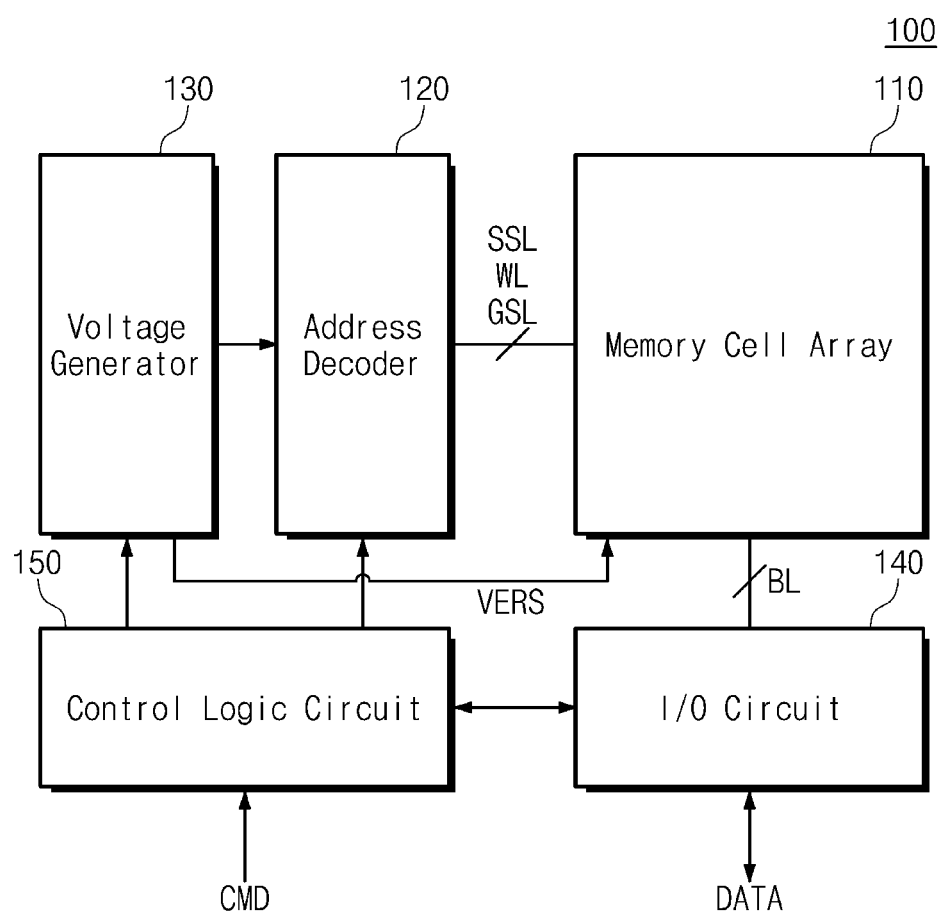
FIG. 1 is a block diagram illustrating a nonvolatile memory device according to an embodiment of the present disclosure.

FIG. 1 is a block diagram illustrating a nonvolatile memory device according to an embodiment of the present disclosure. Referring to FIG. 1, a nonvolatile memory device 100 may include a memory cell array 110, an address decoder 120, a voltage generator 130, an input/output circuit 140, and a control logic circuit 150.

The memory cell array 110 may include a plurality of memory blocks. Each of the plurality of memory blocks may include a plurality of cell strings, and each of the plurality of cell strings may be connected to a corresponding bit line of a plurality of bit lines BL. Each of the plurality of cell strings may include a plurality of cell transistors connected in series. The plurality of cell transistors may be connected to string selection lines SSL, word lines WL, and ground selection lines GSL.

The address decoder 120 may be connected to the memory cell array 110 through the string selection lines SSL, the word lines WL, and the ground selection lines GSL. The address decoder 120 may receive an address ADDR from an external device (e.g., a memory controller) and may decode the received address ADDR. The address decoder 120 may control the string selection lines SSL, the word lines WL, and the ground selection lines GSL based on the decoded address. For example, under control of the control logic circuit 150, the address decoder 120 may provide various voltages from the voltage generator 130 to the string selection lines SSL, the word lines WL, and the ground selection lines GSL based on the decoded address.

The voltage generator 130 may generate various voltages necessary for the nonvolatile memory device 100 to operate. For example, the voltage generator 130 may be configured to generate the following voltages to be provided to the string selection lines SSL, the word lines WL, the ground selection lines GSL, or any other components depending on an operation of the nonvolatile memory device 100: a plurality of program voltages, a plurality of program verification voltages, a plurality of pass voltages, a plurality of read voltages, a plurality of read pass voltages, a plurality of erase voltages VERS, a plurality of erase verification voltages, and a plurality of word line erase voltages.

The input/output circuit 140 may be connected to the memory cell array 110 through the plurality of bit lines BL. The input/output circuit 140 may exchange data "DATA" with the external device (e.g., a memory controller). The input/output circuit 140 may temporarily store the data "DATA" received from the external device or may temporarily store the data "DATA" read from the memory cell array 110. The input/output circuit 140 may control the plurality of bit lines BL such that the data "DATA" received from the external device are stored in the memory cell array 110. The input/output circuit 140 may read the data "DATA" from the memory cell array 110 by sensing voltages of the plurality of bit lines BL.

The control logic circuit 150 may control various components in response to a command CMD from the external device such that the nonvolatile memory device 100 performs an operation corresponding to the command CMD.

Figure 2:
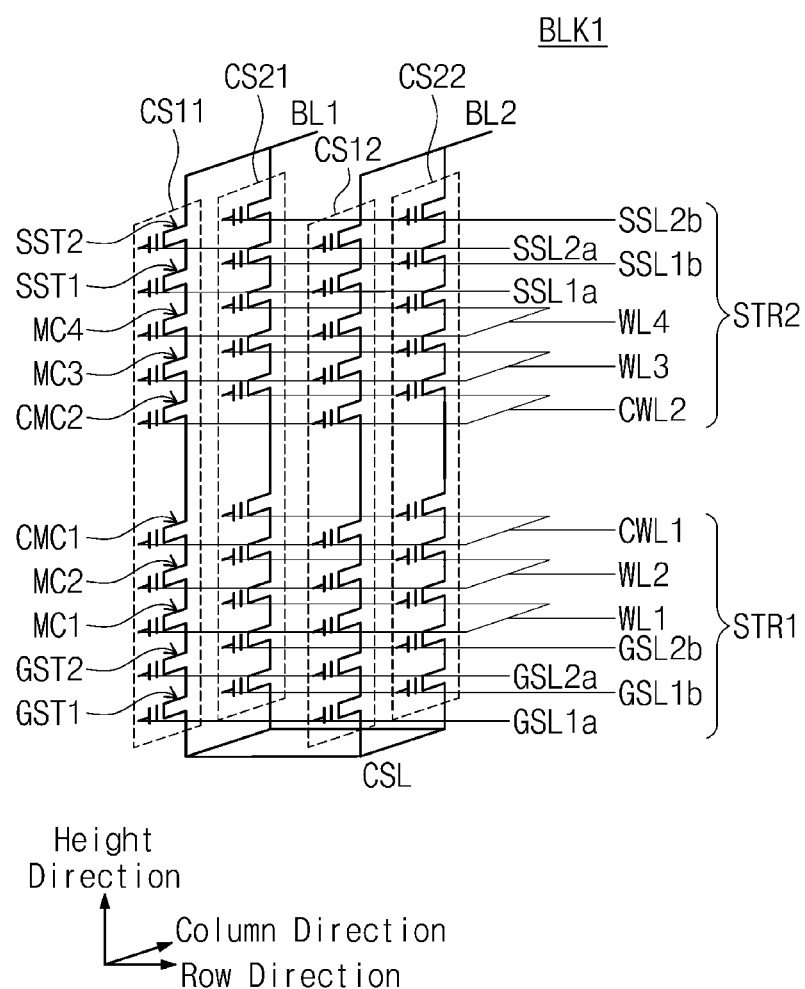
FIG. 2 is a circuit diagram illustrating a first memory block of a plurality of memory blocks included in a memory cell array in FIG. 1.
Figure 3:
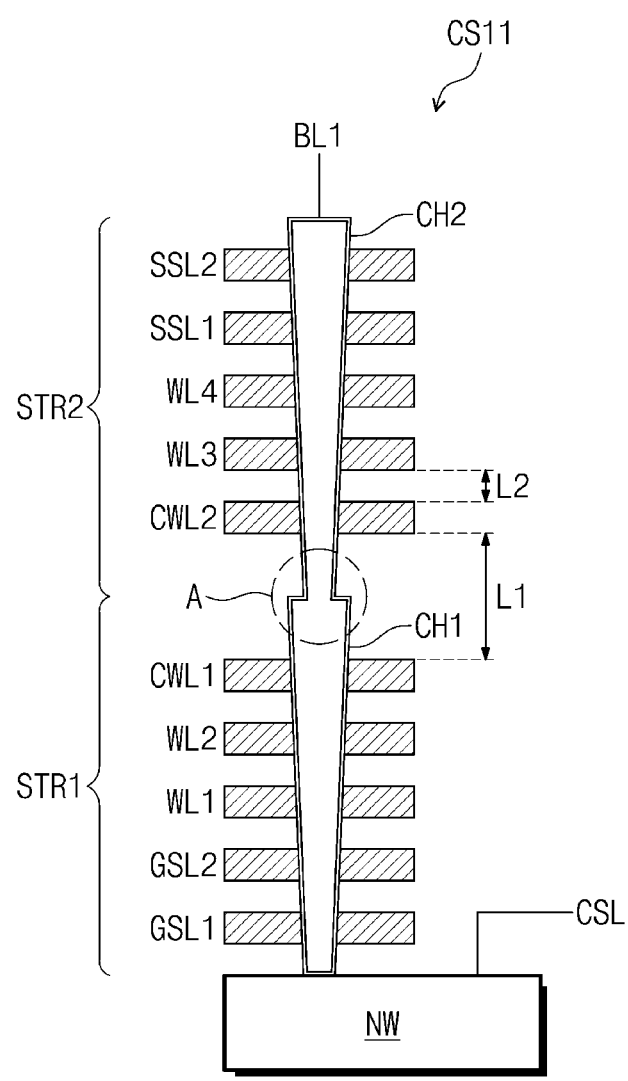
FIG. 3 is a vertical cross-sectional view illustrating a first cell string of cell strings of FIG. 2.

FIG. 2 is a circuit diagram illustrating a first memory block of a plurality of memory blocks included in a memory cell array in FIG. 1. FIG. 3 is a vertical cross-sectional view illustrating a first cell string of cell strings of FIG. 2. For brevity of drawing and convenience of description, a first memory block BLK1 and a first cell string CS11 will be described with reference to FIGS. 2 and 3, but the present disclosure is not limited thereto. Structures of the remaining memory blocks or the remaining cell strings may be similar to the structures of the first memory block BLK1 and the first cell string CS11 to be described with reference to FIGS. 2 and 3.

Referring to FIGS. 1 to 3, the first memory block BLK1 may be formed on a substrate (not illustrated). The first memory block BLK1 may include a plurality of cell strings CS11, CS12, CS21, and CS22 vertically stacked on the substrate. The plurality of cell strings CS11, CS12, CS21, and CS22 may be arranged in a row direction and a column direction.

Cell strings placed at the same column from among the plurality of cell strings CS11, CS12, CS21, and CS22 may be connected to the same bit line. For example, the cell strings CS11 and CS21 may be connected to a first bit line BL1, and the cell strings CS12 and CS22 may be connected to a second bit line BL2. Each of the plurality of cell strings CS11, CS12, CS21, and CS22 may include a plurality of cell transistors. Each of the plurality of cell transistors may include a charge trap flash (CTF) memory cell, but the present disclosure is not limited thereto. The plurality of cell transistors may be stacked in a height direction that is a direction perpendicular to a plane defined by the row direction and the column direction (e.g., the substrate (not illustrated)).

Below, for convenience of description, a structure and configuration of a cell string will be described with reference to the first cell string CS11. Structures and configurations of the remaining cell strings CS12, CS21, and CS22 may be similar to the structure and the configuration of the first cell string CS11, and thus, additional description will be omitted to avoid redundancy.

The plurality of cell transistors may be connected in series between the first bit line BL1 and a common source line CSL. For example, the plurality of cell transistors may include string selection transistors SST1 and SST2, memory cells MC1 to MC4, memory cells CMC1 and CMC2 (hereinafter referred to as "junction memory cells") placed at a junction portion of memory structures, and ground selection transistors GST1 and GST2. The memory cells MC1 to MC4 may be referred to as normal memory cells. The string selection transistors SST1 and SST2 that are connected in series may be provided or connected between the memory cell MC4 and the first bit line BL1. The ground selection transistors GST1 and GST2 that are connected in series may be provided or connected between the memory cell MC1 and the common source line CSL.

The first memory cell MC1, the second memory cell MC2, the first junction memory cell CMC1, the second junction memory cell CMC2, the third memory cell MC3, and the fourth memory cell MC4 may be connected in series between the string selection transistor SST1 and the ground selection transistor GST2.

In each of the plurality of cell strings CS11, CS12, CS21, and CS22, memory cells placed at the same height from among the memory cells MC1 to MC4 may share the same word line. For example, the first memory cells MC1 of the plurality of cell strings CS11, CS12, CS21, and CS22 may be placed at the same height from the substrate (not illustrated) and may share a first word line WL1. The second memory cells MC2 of the plurality of cell strings CS11, CS12, CS21, and CS22 may be placed at the same height from the substrate (not illustrated) and may share a second word line WL2. Likewise, the third memory cells MC3 of the plurality of cell strings CS11, CS12, CS21, and CS22 may be placed at the same height from the substrate (not illustrated) and may share a third word line WL3, and the fourth memory cells MC4 of the plurality of cell strings CS11, CS12, CS21, and CS22 may be placed at the same height from the substrate (not illustrated) and may share a fourth word line WL4. The word lines WL1 to WL4 may be referred to as normal word lines.

Junction memory cells placed at the same height from among the junction memory cells CMC1 and CMC2 of the plurality of cell strings CS11, CS12, CS21, and CS22 may share the same word line (hereinafter referred to as a "junction word line") placed at the junction portion. For example, the first junction memory cells CMC1 of the plurality of cell strings CS11, CS12, CS21, and CS22 may share a first junction word line CWL1, and the second junction memory cells CMC2 of the plurality of cell strings CS11, CS12, CS21, and CS22 may share a second junction word line CWL2.

String selection transistor placed at the same height and the same row from among the string selection transistors SST1 and SST2 of the plurality of cell strings CS11, CS12, CS21, and CS22 may share the same string selection line. For example, the string selection transistors SST2 of the cell strings CS11 and CS12 may be connected to a string selection line SSL2a, and the string selection transistors SST1 of the cell strings CS11 and CS12 may be connected to a string selection line SSL1a. The string selection transistors SST2 of the cell strings CS21 and CS22 may be connected to a string selection line SSL2b, and the string selection transistors SST1 of the cell strings CS21 and CS22 may be connected to a string selection line SSL1b.

Although not illustrated in FIG. 2, string selection transistors placed at the same row from among the string selection transistors SST1 and SST2 of the plurality of cell strings CS11, CS12, CS21, and CS22 may share the same string selection line. For example, the string selection transistors SST1 and SST2 of the cell strings CS11 and CS12 may share a first string selection line, and the string selection transistors SST1 and SST2 of the cell strings CS21 and CS22 may share a second string selection line different from the first string selection line.

Ground selection transistors placed at the same height and the same row from among the ground selection transistors GST1 and GST2 of the plurality of cell strings CS11, CS12, CS21, and CS22 may share the same ground selection line. For example, the ground selection transistors GST1 of the cell strings CS11 and CS12 may be connected to a ground selection line GSL1a, and the ground selection transistors GST2 of the cell strings CS11 and CS12 may share a ground selection line GSL2a. The ground selection transistors GST1 of the cell strings CS21 and CS22 may be connected to a ground selection line GSL1b, and the ground selection transistors GST2 of the cell strings CS21 and CS22 may be connected to a ground selection line GSL2b.

As illustrated in FIG. 2, the ground selection transistors GST1 and GST2 of the plurality of cell strings CS11, CS12, CS21, and CS22 may share the same ground selection line. Alternatively, ground selection transistors placed at the same height from among the ground selection transistors GST1 and GST2 of the plurality of cell strings CS11, CS12, CS21, and CS22 may share the same ground selection line. Alternatively, ground selection transistors placed at the same row from among the ground selection transistors GST1 and GST2 of the plurality of cell strings CS11, CS12, CS21, and CS22 may share the same ground selection line.

In an embodiment, the first memory block BLK1 illustrated in FIG. 2 is exemplary. The number of cell strings may increase or decrease, and the number of rows of cell strings and the number of columns of cell strings may increase or decrease depending on the number of cell strings. Also, the first memory block BLK1 may further include dummy memory cells. For example, each cell string may include one or more dummy memory cells. In the first memory block BLK1, the number of cell transistors may increase or decrease, and the height of the first memory block BLK1 may increase or decrease depending on the number of cell transistors. Also, the number of lines connected to cell transistors may increase or decrease depending on the number of cell transistors.

In an embodiment, the first memory block BLK1 may have a multi-stacked structure. For example, as illustrated in FIGS. 2 and 3, the first memory block BLK1 may include a first structure STR1 and a second structure STR2. The first structure STR1 may include first cell transistors GST1, GST2, MC1, MC2, and CMC1 of cell transistors in the plurality of cell strings CS11, CS12, CS21, and CS22, and the second structure STR2 may include second cell transistors CMC2, MC3, MC4, SST1, and SST2 of the cell transistors in plurality of cell strings CS11, CS12, CS21, and CS22.

The first structure STR1 may be formed on the substrate, and the second structure STR2 may be formed over the first structure STR1. For example, as illustrated in FIG. 3, the first structure STR1 may be formed on an N-well of the substrate. In an embodiment, a peripheral circuit (e.g., the address decoder 120, the voltage generator 130, the input/output circuit 140, and the control logic circuit 150 of FIG. 1) may be formed under the N-well of the substrate. That is, the nonvolatile memory device 100 may be formed in a cell-on-peripheral (COP) structure or a CMOS under array (CUA) structure. In this case, the substrate that is connected to cell strings may be of an N-type. However, the present disclosure is not limited thereto. For example, the substrate that is connected to cell strings may be of a P-type.

The second structure STR2 may be formed over the first structure STR1. In this case, as illustrated in FIG. 3, a channel diameter may change in an area "A" where the first structure STR1 and the second structure STR2 are electrically connected to each other. For example, the area "A" may be a part of the junction portion of memory structures. For example, a first channel CH1 of the first structure STR1 may be formed to penetrate the lines GSL1, GSL2, WL1, WL2, and CWL1 vertically stacked on the substrate, and a second channel CH2 of the second structure STR2 may be formed to penetrate the lines CWL2, WL3, WL4, SSL1, and SSL2 stacked on the first structure STR1. The first channel CH1 of the first structure STR1 may be formed in a first channel hole and the second channel CH2 of the second structure STR2 may be formed in a second channel hole. The first channel hole and the second channel hole may be formed at a different time during manufacturing the nonvolatile memory devices 100. The first channel CH1 of the first structure STR1 and the second channel CH2 of the second structure STR2 may be electrically connected to each other in the area "A". For example, as illustrated in FIG. 3, in the area "A" where the first structure STR1 and the second structure STR2 are electrically connected to each other, a channel diameter of the second structure STR2 may be smaller than a channel diameter of the first structure STR1.

In an embodiment, the uppermost word line of the first structure STR1 may be the first junction word line CWL1, and the lowermost word line of the second structure STR2 may be the second junction word line CWL2. In other words, the first junction word line CWL1 may be a word line being the closest to the second structure STR2 from among word lines of the first structure STR1, and the second junction word line CWL2 may be a word line being the closest to the first structure STR1 from among word lines of the second structure STR2.

As illustrated in FIG. 3, a channel diameter corresponding to the first junction word line CWL1 may be greater than a channel diameter corresponding to the second junction word line CWL2. Alternatively, a distance L1 between the first and second junction word lines CWL1 and CWL2 may be greater than a distance (e.g., L2) between the remaining word lines other than the first and second junction word lines CWL1 and CWL2. Due to the physical or structural characteristic described above, the junction memory cells CMC1 and CMC2 connected to the first and second junction word lines CWL1 and CWL2 may not be used for the purpose of storing actual data (or, user data) and may be set to have a specific threshold voltage.

However, as the number of program/erase cycles of the nonvolatile memory device 100 increases, charges may be trapped in a channel belonging to the area "A" where the first and second structures STR1 and STR2 are electrically connected to each other, thereby causing an increase in threshold voltages of the junction memory cells CMC1 and CMC2. The increase in the threshold voltages of the junction memory cells CMC1 and CMC2 may cause an error in a read operation of the nonvolatile memory device 100.

The nonvolatile memory device 100 according to an embodiment of the present disclosure may perform an erase operation on the junction memory cells CMC1 and CMC2 such that threshold voltages of the junction memory cells CMC1 and CMC2 are maintained at a given level. As such, it may be possible to prevent an error from occurring in the read operation.

Below, to describe the present disclosure easily, the erase operation of the nonvolatile memory device 100 according to an embodiment of the present disclosure will be mainly described. However, the present disclosure is not limited thereto. For example, the nonvolatile memory device 100 may perform a program operation or a read operation as well as the erase operation.

Figure 4:
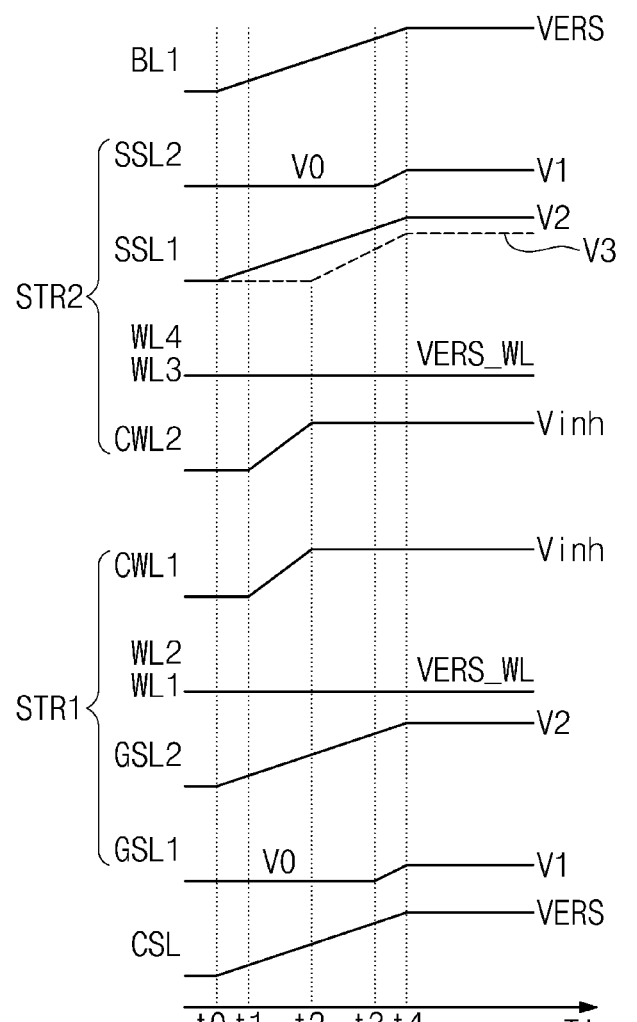
FIG. 4 is a timing diagram illustrating an erase operation of a nonvolatile memory device of FIG. 1 according to example embodiments.

FIG. 4 is a timing diagram illustrating an erase operation of a nonvolatile memory device of FIG. 1 according to example embodiments. For convenience, the description will be given as the nonvolatile memory device 100 performs the erase operation according to the timing diagram of FIG. 4. However, the present disclosure is not limited thereto.

Below, the terms "normal word line" and "junction word line" are used for convenience of description. The normal word line may indicate a word line connected to a memory cell used to store actual data from among memory cells included in a memory block, and the junction word line may indicate a word line of each structure, which is the closest to any other structure, as described above. The normal word line is marked by a reference sign such as WL or NWL, and the junction word line is marked by a reference sign such as CWL.

Below, for convenience, the description will be given as the erase operation is performed on the first memory block BLK1. However, the present disclosure is not limited thereto. For example, the erase operation may be performed on the whole of the first memory block BLK1 or may be performed on cell strings (e.g., CS11 and CS12) placed at the same row from among the cell strings CS11, CS12, CS21, and CS22 of the first memory block BLK1.

Referring to FIGS. 1 to 4, the nonvolatile memory device 100 may perform the erase operation on the first memory block BLK1. For example, at a 0-th time t0, the nonvolatile memory device 100 may start to apply the erase voltage VERS through the first bit line BL1 and the common source line CSL. For example, voltages of the first bit line BL1 and the common source line CSL may increase to the erase voltage VERS from the 0-th time t0 to a fourth time t4. The nonvolatile memory device 100 may be operated in a word line setup phase from the 0-th time t0 to the fourth time t4 and in an erase phase from the fourth time t4.

The nonvolatile memory device 100 may maintain a first ground selection line GSL1 at a 0-th voltage V0 from the 0-th time t0 to a third time t3 and may make the first ground selection line GSL1 floated at the third time t3. As the first ground selection line GSL1 is floated, from the third time t3, the first ground selection line GSL1 may increase to a first voltage V1 by an increased channel voltage coupled with the erase voltage VERS. In an embodiment, the first voltage V1 may correspond to a difference between the erase voltage VERS and a voltage of the common source line CSL at the third time t3. In an embodiment, although not illustrated in FIG. 4, the 0-th voltage V0 may indicate an initial voltage that is provided to each line in the erase operation. In an embodiment, the 0-th voltage V0 may be a ground voltage, a given positive voltage, or a given negative voltage.

The nonvolatile memory device 100 may make a second ground selection line GSL2 floated at the 0-th time t0. As the second ground selection line GSL2 is floated, from the 0-th time to, the second ground selection line GSL2 may increase to a second voltage V2 by the increased channel voltage. In an embodiment, the second voltage V2 may correspond to the erase voltage VERS. In an embodiment, the second voltage V2 may be greater than the first voltage V1 and less than the erase voltage VERS.

The nonvolatile memory device 100 may apply a word line erase voltage VERS_WL to first to fourth normal word lines WL1 to WL4. In an example embodiment, the word line erase voltage VERS_WL may be less than the first voltage V1. In an example embodiment, the word line erase voltage VERS_WL may be equal to or less than the 0-th voltage V0.

The nonvolatile memory device 100 may apply an erase inhibit voltage Vinh to the first and second junction word lines CWL1 and CWL2, at a first time t1. For example, the erase inhibit voltage Vinh may be applied by floating the first and second junction word lines CWL1 and CWL2 from the first time t1 or by directly applying the erase inhibit voltage Vinh to the first and second junction word lines CWL1 and CWL2 at the first time t1. In an embodiment, the erase inhibit voltage Vinh may be greater than the first voltage V1 and the word line erase voltage VERS_WL or the junction word line erase voltage VERS_CWL.

The nonvolatile memory device 100 may make the first string selection line SSL1 floated at the 0-th time t0. As the first string selection line SSL1 is floated, from the 0-th time t0, the first string selection line SSL1 may increase to the second voltage V2.

The nonvolatile memory device 100 may maintain the second string selection line SSL2 at the 0-th voltage V0 from the 0-th time t0 to the third time t3 and may make the second string selection line SSL2 floated at the third time t3. As the second string selection line SSL2 is floated, from the third time t3, the second string selection line SSL2 may increase to the first voltage V1.

In an embodiment, according to the timing diagram illustrated in FIG. 4, the nonvolatile memory device 100 may perform the erase operation by using a gate induced drain leakage (GIDL) manner. For example, during a time period from the 0-th time t0 to the third time t3, a GIDL current may be generated at an upper end (i.e., on a bit line side) and a lower end (i.e., a common source line side) of the first memory block BLK1. In the case of the common source line (CSL) side, while the erase voltage VERS is applied to the common source line CSL from the 0-th time t0 to the third time t3, the first ground selection line GSL1 may maintain the 0-th voltage V0 that is relatively small. In this case, the GIDL may occur at a first ground selection transistor GST1, and holes generated by the GIDL may be injected into a channel of a cell string of the first memory block BLK1. As such, a potential of the channel of the cell string may increase to the erase voltage VERS. In the case of the first bit line (BL1) side, holes may be injected into the channel of the cell string from the first bit line BL1 through a GIDL mechanism similar to that of the common source line (CSL) side, and thus, additional description will be omitted to avoid redundancy.

As described above, a channel voltage of the cell string may increase through the GIDL current from the first bit line BL1 and the GIDL current from the common source line CSL and may reach the erase voltage VERS at the fourth time t4.

After the fourth time t4, voltages of the respective lines may be maintained as illustrated in FIG. 4, and thus, the normal memory cells MC1 to MC4 connected to the first to fourth normal word lines WL1 to WL4 to which the word line erase voltage VERS_WL is applied may be erased. The junction memory cells CMC1 and CMC2 connected to the first and second junction word lines CWL1 and CWL2 to which the erase inhibit voltage Vinh is applied may not be erased. For example, threshold voltages of the junction memory cells CMC1 to CMC2 may be maintained.

In an embodiment, the nonvolatile memory device 100 may float the first string selection line SSL1 at a second time t2, not at the 0-th time t0. In this case, the first string selection line SSL1 may increase to a third voltage V3. The third voltage V3 may be smaller than the second voltage V2. In an embodiment, an operation of controlling the first string selection line SSL1 may be variously changed or modified depending on a structural characteristic of the string selection lines SSL1 and SSL2, without departing from the scope and spirit of the present disclosure.

Figure 5:
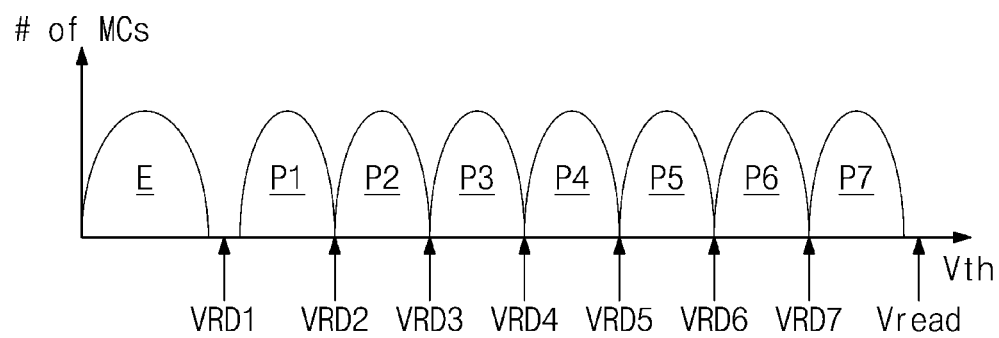
FIG. 5 illustrates threshold voltage distributions of memory cells included in a nonvolatile memory device of FIG. 1.
Figure 5:
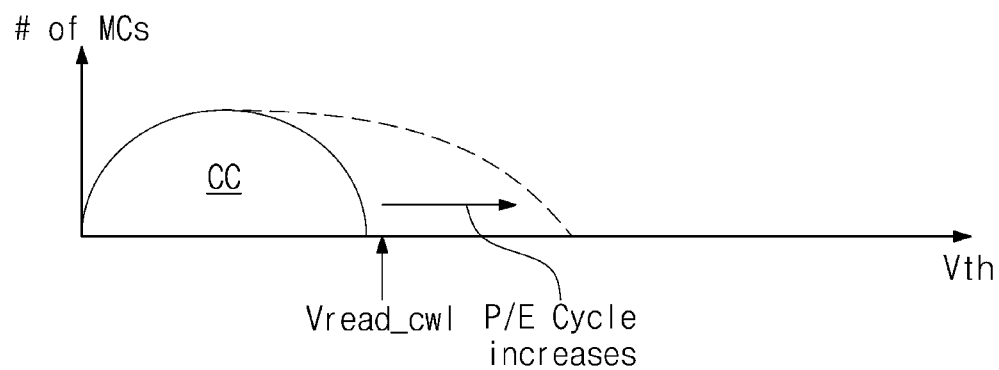

FIG. 5 illustrates threshold voltage distributions of memory cells included in a nonvolatile memory device of FIG. 1. Referring to FIGS. 1, 2, and 5, memory cells included in the nonvolatile memory device 100, in particular, each of the normal memory cells (e.g., MC1, MC2, MC3, and MC4 of FIG. 2) connected to normal word lines may have one of an erase state "E" and first to seventh program states P1 to P7. In an embodiment, each of the normal memory cells may be a triple level cell storing three bits, but the present disclosure is not limited thereto.

The junction memory cells CMC1 and CMC2 included in the nonvolatile memory device 100 may form a specific threshold voltage distribution CC. That is, the junction memory cells CMC1 and CMC2 may not store data and may be set to have a specific threshold voltage.

As illustrated in FIG. 5, the nonvolatile memory device 100 may read data stored in the normal memory cells MC1, MC2, MC3, and MC4 by using a plurality of read voltages VRD1 to VRD7. To read data stored in a selected normal memory cell MC1, MC2, MC3, or MC4, both junction memory cells and the remaining normal memory cells other than the selected normal memory cell may have to maintain a turn-on state. That is, in the read operation of the nonvolatile memory device 100, a junction word line pass voltage Vread_cwl may be applied to the junction word lines CWL1 and CWL2 connected to the junction memory cells CMC1 and CMC2. The junction word line pass voltage Vread_cwl may be greater than an upper limit of the specific threshold voltage distribution CC. In an embodiment, the junction word line pass voltage Vread_cwl may be lower in level than a read pass voltage Vread to be applied to normal word lines connected to normal memory cells.

In an embodiment, as the number of program/erase cycles of the nonvolatile memory device 100 increases, threshold voltages of the junction memory cells CMC1 and CMC2 may increase and may be greater than the junction word line pass voltage Vread_cwl. In this case, in the read operation of the nonvolatile memory device 100, even though the junction word line pass voltage Vread_cwl is applied to the junction word lines CWL1 and CWL2, the junction memory cells CMC1 and CMC2 may maintain a turn-off state. This may mean that data are not correctly read from the normal memory cells MC1 to MC4. That is, a change in threshold voltages of the junction memory cells CMC1 and CMC2 may cause a read error.

Figure 6:
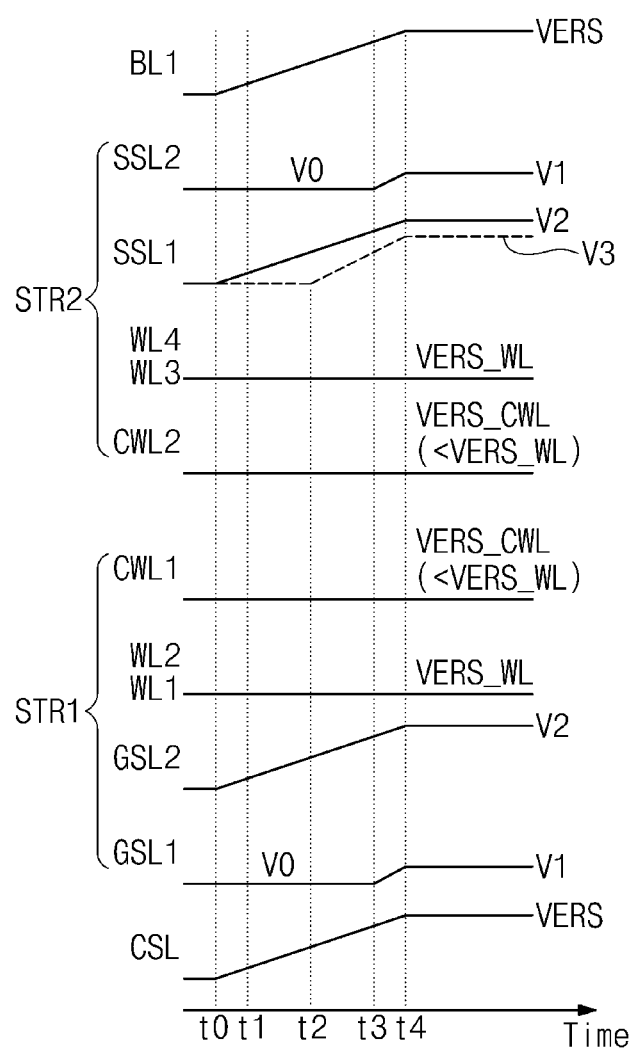
FIGS. 6 to 8 are timing diagrams illustrating erase operations of a nonvolatile memory device of FIG. 1 according to example embodiments.
Figure 7:
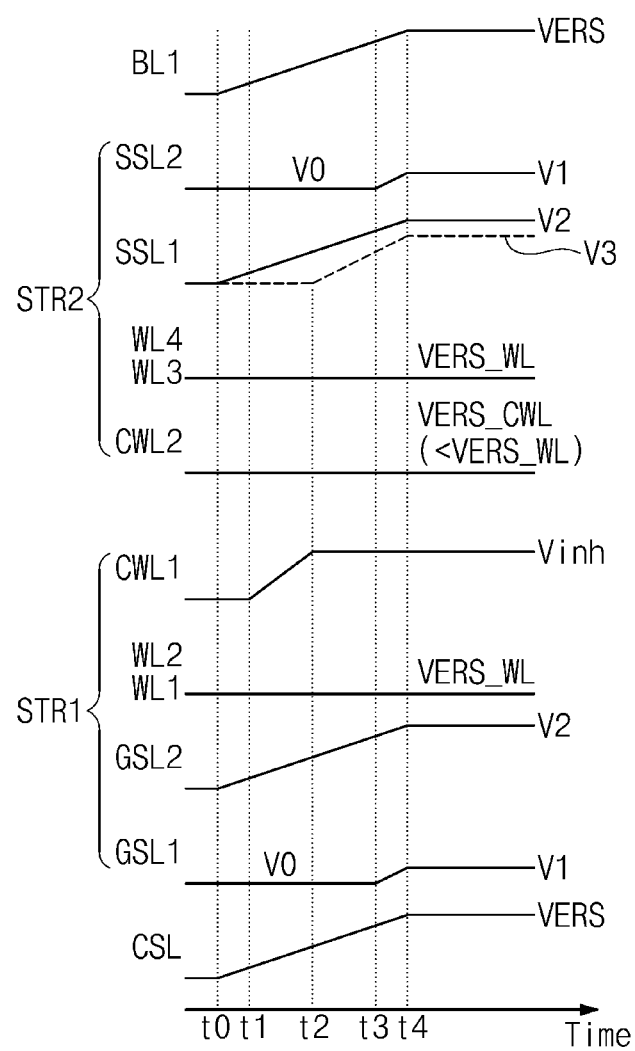
Figure 8:
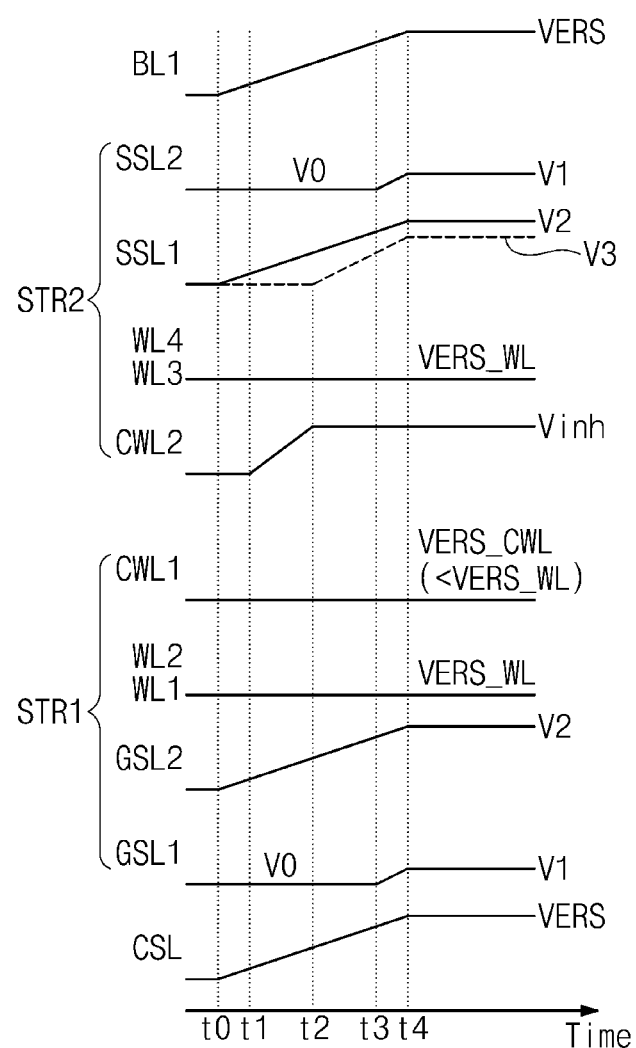

FIGS. 6 to 8 are timing diagrams illustrating erase operations of a nonvolatile memory device of FIG. 1 according to example embodiments. Below, an erase operation associated with junction memory cells will be described with reference to the accompanying drawings. For convenience of description, additional description associated with the components or operations described above will be omitted to avoid redundancy.

First, referring to FIGS. 1, 2, and 6, the nonvolatile memory device 100 may perform the erase operation on the first memory block BLK1 (e.g., a first erase operation on the junction word lines CWL and the normal word lines NWL). In an embodiment, the erase operation described with reference to FIG. 4 may be an erase operation associated with normal memory cells (e.g., MC1, MC2, MC3, and MC4) of memory cells belonging to the first memory block BLK1. That is, as the erase operation of FIG. 4 is performed, the normal memory cells (e.g., MC1, MC2, MC3, and MC4) may be erased, while the junction memory cells CMC1 and CMC2 may not be erased.

In contrast, as the erase operation is performed according to the timing diagram illustrated in FIG. 6, as well as the normal memory cells (e.g., MC1, MC2, MC3, and MC4) included in the first memory block BLK1, the junction memory cells CMC1 and CMC2 included therein may be erased. For example, the nonvolatile memory device 100 may not apply the erase inhibit voltage Vinh but apply a junction word line erase voltage VERS_CWL to the junction word lines CWL1 and CWL2 connected to the junction memory cells CMC1 and CMC2. In this case, after the fourth time t4, both the normal memory cells MC1 to MC4 and the junction memory cells CMC1 and CMC2 may be erased by a voltage difference of a channel of a cell string and the word lines WL1 to WL4, CWL1, and CWL2.

In an embodiment, the junction word line erase voltage VERS_CWL applied to the junction word lines CWL1 and CWL2 may be smaller than the word line erase voltage VERS_WL applied to the normal word lines WL1 to WL4. For example, in the case where the word line erase voltage VERS_WL is applied to the junction word lines CWL1 and CWL2, due to a physical characteristic or a physical location of the junction word lines CWL1 and CWL2, the junction memory cells CMC1 and CMC2 may not be correctly erased. For this reason, by applying the junction word line erase voltage VERS_CWL smaller than the word line erase voltage VERS_WL to the junction word lines CWL1 and CWL2, a voltage difference of the channel of the cell string and the junction word lines CWL1 and CWL2 may become relatively great, and thus, the junction memory cells CMC1 and CMC2 may be correctly erased.

In an embodiment, a voltage applied to the junction word lines CWL1 and CWL2 at the 0-th time t0 may be greater than the junction word line erase voltage VERS_CWL.

The biasing for the remaining lines CSL, GSL1, GSL2, WL1~WL4, SSL1, SSL2, and BL1 is identical to the biasing described with reference to FIG. 4, and thus, additional description will be omitted to avoid redundancy.

Next, referring to FIGS. 1, 2, and 7, the nonvolatile memory device 100 may perform the erase operation on the first memory block BLK1 (e.g., a second erase operation on the second junction word line CWL2 and the normal word lines NWL). The nonvolatile memory device 100 may apply the erase inhibit voltage Vinh to the first junction word line CWL1 at a first time t1. In an embodiment, the nonvolatile memory device 100 may apply the erase inhibit voltage Vinh by floating the first junction word line CWL1 at the first time t1. In an embodiment, the nonvolatile memory device 100 may directly apply the erase inhibit voltage Vinh to the first junction word line CWL1 at the first time t1. The nonvolatile memory device 100 may apply the junction word line erase voltage VERS_CWL to the second junction word line CWL2. In an embodiment, a voltage applied to the second junction word line CWL2 at a 0-th time t0 may be greater than the junction word line erase voltage VERS_CWL. For example, the nonvolatile memory device 100 may perform the erase operation on the normal memory cells MC1 to MC4 and the second junction memory cell CMC2 of the first memory block BLK1. The biasing for the remaining lines CSL, GSL1, GSL2, WL1 to WL4, CWL1, SSL1, SSL2, and BL1 is identical to the biasing described with reference to FIG. 4 except that the junction word line erase voltage VERS_CWL is applied to the second junction word line CWL2, and thus, additional description will be omitted to avoid redundancy.

Then, referring to FIGS. 1, 2, and 8, the nonvolatile memory device 100 may perform the erase operation on the first memory block BLK1 (e.g., a third erase operation on the first junction word line CWL1 and the normal word lines NWL). The nonvolatile memory device 100 may apply the erase inhibit voltage Vinh to the second junction word line CWL2 at a first time t1. In an embodiment, the nonvolatile memory device 100 may apply the erase inhibit voltage Vinh by floating the second junction word line CWL2 at the first time t1. In an embodiment, the nonvolatile memory device 100 may directly apply the erase inhibit voltage Vinh to the second junction word line CWL2 at the first time t1. The nonvolatile memory device 100 may apply the junction word line erase voltage VERS_CWL to the first junction word line CWL1. In an embodiment, a voltage applied to the first junction word line CWL1 at a 0-th time t0 may be greater than the junction word line erase voltage VERS_CWL. For example, the nonvolatile memory device 100 may perform the erase operation on the normal memory cells MC1 to MC4 and the first junction memory cell CMC1 of the first memory block BLK1. The biasing for the remaining lines CSL, GSL1, GSL2, WL1 to WL4, CWL2, SSL1, SSL2, and BL1 is identical to the biasing described with reference to FIG. 4 except that the junction word line erase voltage VERS_CWL is applied to the first junction word line CWL1, and thus, additional description will be omitted to avoid redundancy.

As described above, the nonvolatile memory device 100 according to example embodiments of the present disclosure may perform the erase operation on junction memory cells connected to junction word lines, as well as normal memory cells. In this case, even though the number of program/erase cycles of the nonvolatile memory device 100 increases, because threshold voltages of the junction memory cells CMC1 and CMC2 are maintained at a specific level or lower, an error due to a threshold voltage change of the junction memory cells CMC1 and CMC2 may be prevented in the read operation of the nonvolatile memory device 100.

In an embodiment, as illustrated in FIG. 7, in the case where a voltage level of the second junction word line CWL2 is a level of the junction word line erase voltage VERS_CWL and a voltage level of the first junction word line CWL1 is a level of the erase inhibit voltage Vinh, the GIDL phenomenon may occur due to a voltage level difference of the first and second junction word lines CWL1 and CWL2. A GIDL current that is generated by the junction word lines CWL1 and CWL2 may flow toward the first junction word line CWL1 from the second junction word line CWL2. In this case, a channel between the first and second junction word lines CWL1 and CWL2 may be quickly charged to the erase voltage VERS.

Likewise, as illustrated in FIG. 8, in the case where a voltage level of the first junction word line CWL1 is a level of the junction word line erase voltage VERS_CWL and a voltage level of the second junction word line CWL2 is a level of the erase inhibit voltage Vinh, the GIDL phenomenon may occur due to a voltage level difference of the first and second junction word lines CWL1 and CWL2. A GIDL current that is generated by the junction word lines CWL1 and CWL2 may flow toward the second junction word line CWL2 from the first junction word line CWL1. In this case, a channel between the first and second junction word lines CWL1 and CWL2 may be quickly charged to the erase voltage VERS.

Figure 9:
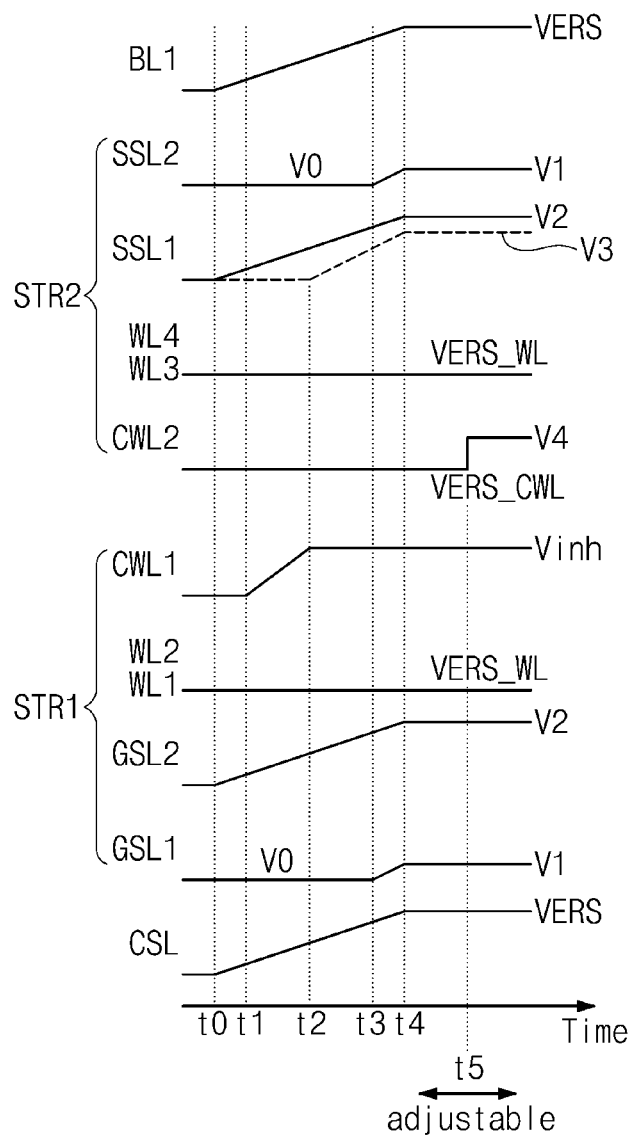
FIG. 9 is a timing diagram illustrating an erase operation of a nonvolatile memory device of FIG. 1 according to example embodiments.

FIG. 9 is a timing diagram illustrating an erase operation of a nonvolatile memory device of FIG. 1 according to example embodiments. For convenience of description, additional description associated with the components described above will be omitted to avoid redundancy.

Referring to FIGS. 1, 2, 5, and 9, the nonvolatile memory device 100 may perform the erase operation on the first memory block BLK1 (e.g., a fourth erase operation on the second junction word line CWL2 and the normal word lines NWL). During a time period from the 0-th time t0 to the fourth time t4, the nonvolatile memory device 100 may control respective lines to be similar to that described with reference to FIG. 7. At a fifth time t5, the nonvolatile memory device 100 may increase a voltage level of the second junction word line CWL2 from the junction word line erase voltage VERS_CWL to a fourth voltage V4. In this case, the second junction memory cell CMC2 connected to the second junction word line CWL2 may be erased only during a time period from the fourth time t4 to the fifth time t5. For example, the second junction memory cell CMC2 may be prevented from being over-erased by increasing the voltage level of the second junction word line CWL2 to the fourth voltage V4 during an erase phase (e.g., after the fourth time t4). In an example embodiment, the fourth voltage V4 may be greater than the word line erase voltage VERS_WL.

For example, as illustrated in FIG. 5, an upper limit of a threshold voltage distribution of the junction memory cells CMC1 and CMC2 may be higher than an upper limit of a threshold voltage distribution of the normal memory cells MC1 to MC4 of the erase state "E". For example, in the erase phase, in the case where the junction word lines CWL1 and CWL2 are maintained at the junction word line erase voltage VERS_CWL, the junction memory cells CMC1 and CMC2 may be over-erased, that is, threshold voltages of the junction memory cells CMC1 and CMC2 may be smaller than the upper limit of the threshold voltage distribution of the normal memory cells MC1 to MC4 of the erase state "E". The over-erasing causes the degradation of the junction memory cells CMC1 and CMC2.

According to an embodiment of the present disclosure, the junction memory cells CMC1 and CMC2 may be prevented from being over-erased by increasing a voltage level of the junction word line CWL1 or CWL2 from the junction word line erase voltage VERS_CWL to the fourth voltage V4 during the erase phase.

In an embodiment, the fifth time t5 when a voltage level of the junction word line CWL is changed may be adjustable depending on a state or an intended target threshold voltage of the junction memory cells CMC1 and CMC2. In an embodiment, whether to change the fifth time t5 may be determined based on a cell counting result associated with the junction word lines CWL1 and CWL2.

The biasing for the remaining lines CSL, GSL1, GSL2, WL1 to WL4, CWL1, SSL1, SSL2, and BL1 is identical to the biasing described above, and thus, additional description will be omitted to avoid redundancy.

An embodiment is described with reference to FIG. 9 as a voltage level of the second junction word line CWL2 is changed during the erase phase, but the present disclosure is not limited thereto. For example, the embodiment of FIG. 9, that is, a configuration for changing a voltage level of a junction word line during the erase phase may be applied to the erase operations described with reference to FIGS. 6 to 8. For example, the nonvolatile memory device 100 may apply the junction word line erase voltage VERS_CWL to the first and second junction word lines CWL1 and CWL2 during a word line setup interval and may change a voltage of each of the first and second junction word lines CWL1 and CWL2 to the fourth voltage V4 during the erase phase. In an embodiment, timings for controlling the first and second junction word lines CWL1 and CWL2 may be variously changed.

Figure 10:
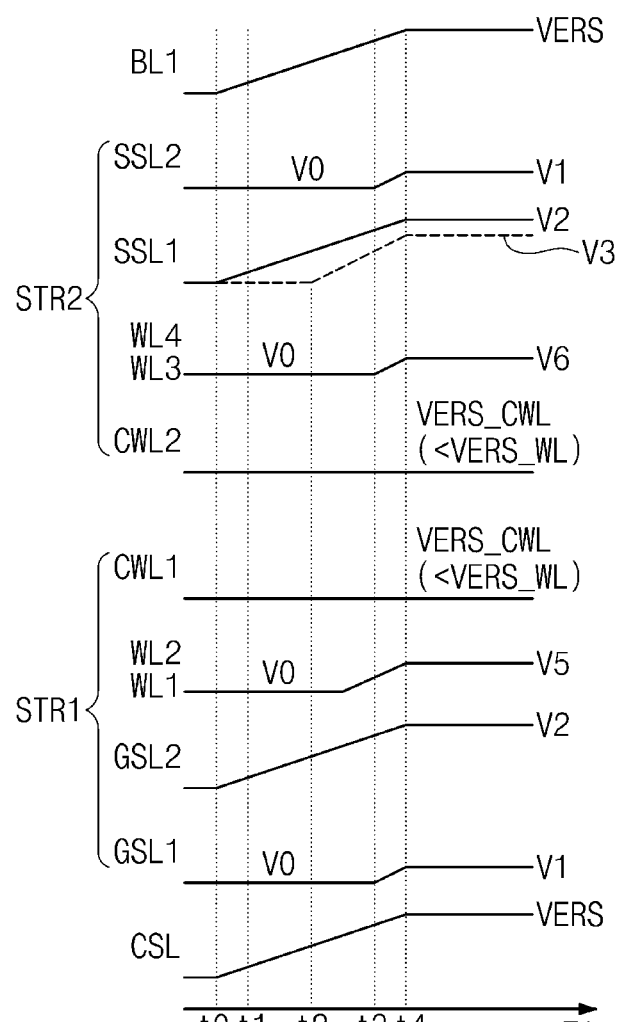
FIG. 10 is a timing diagram illustrating an erase operation of a nonvolatile memory device of FIG. 1 according to example embodiments.

FIG. 10 is a timing diagram illustrating an erase operation of a nonvolatile memory device of FIG. 1 according to example embodiments. For convenience of description, additional description associated with the components described above will be omitted to avoid redundancy. Referring to FIGS. 1, 2, and 10, the nonvolatile memory device 100 may perform the erase operation on the first memory block BLK1 (e.g., an erase operation on junction word lines CWL). The nonvolatile memory device 100 may apply the junction word line erase voltage VERS_CWL to the first and second junction word lines CWL1 and CWL2.

In this case, unlike the above description, the nonvolatile memory device 100 may apply a fifth voltage V5 or a sixth voltage V6 to the first to fourth normal word lines WL1 to WL4. For example, the nonvolatile memory device 100 may maintain a voltage of the first and second normal word lines WL1 and WL2 at the 0-th voltage V0 from a 0-th time t0 to a time point between a second time t2 and a third time t3 and may float the first and second normal word lines WL1 and WL2 at the time point between the second time t2 and the third time t3. In this case, a voltage level of the first and second normal word lines WL1 and WL2 may increase to the fifth voltage V5. In an embodiment, the nonvolatile memory device 100 may control the third and fourth normal word lines WL3 and WL4 in a similar manner.

In an embodiment, the nonvolatile memory device 100 may maintain a voltage of the third and fourth normal word lines WL3 and WL4 at the 0-th voltage V0 from the 0-th time t0 to the third time t3 and may float the third and fourth normal word lines WL3 and WL4 at the third time t3. A voltage level of the third and fourth normal word lines WL3 and WL4 may increase to the sixth voltage V6. In an embodiment, the nonvolatile memory device 100 may control the first and second normal word lines WL1 and WL2 in a similar manner.

In an embodiment, the sixth voltage V6 may be smaller than the fifth voltage V5. In an embodiment, a time point when the first and second normal word lines WL1 and WL2 are floated may be different from a time point when the third and fourth normal word lines WL3 and WL4 are floated. However, the present disclosure is not limited thereto.

As described above, the nonvolatile memory device 100 may maintain a voltage of the first and second junction word lines CWL1 and CWL2 at the junction word line erase voltage VERS_CWL and may float the first to fourth normal word lines WL1 to WL4 before the erase phase. In this case, in the erase phase, the first and second junction memory cells CMC1 and CMC2 connected to the first and second junction word lines CWL1 and CWL2 may be erased, but memory cells connected to the first to fourth normal word lines WL1 to WL4 may not be erased. For example, the nonvolatile memory device 100 may erase only the junction memory cells CMC1 and CMC2 through the erase operation that is based on the timing diagram of FIG. 10.

Biasing for the remaining lines is similar to the biasing described above, and thus, additional description will be omitted to avoid redundancy.

An embodiment where the junction word line erase voltage VERS_CWL is applied to the first and second junction word lines CWL1 and CWL2 is described with reference to the timing diagram of FIG. 10, but the present disclosure is not limited thereto. It may be understood that a voltage applied to a junction word line is capable of being implemented depending on one of the embodiments described with reference to FIGS. 6 to 9 or a combination thereof.

Figure 11:
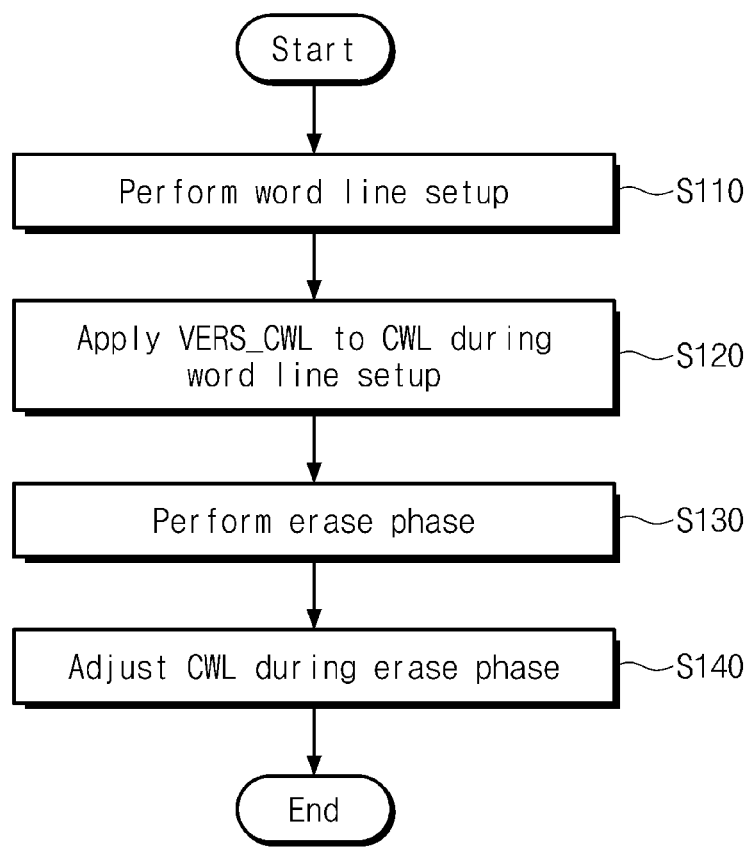
FIG. 11 is a flowchart illustrating an operation of a nonvolatile memory device of FIG. 1 according to example embodiments.

FIG. 11 is a flowchart illustrating an operation of a nonvolatile memory device of FIG. 1 according to example embodiments. Referring to FIGS. 1, 2, and 11, in operation S110, the nonvolatile memory device 100 may perform a word line setup operation. For example, in the embodiments described with reference to FIGS. 4 to 10, the word line setup operation may indicate a time period from the 0-th time t0 to the fourth time t4 (i.e., a time period where a voltage of the common source line CSL or the bit line BL increases to the erase voltage VERS).

In operation S120, the nonvolatile memory device 100 may apply the junction word line erase voltage VERS_CWL to the junction word line CWL during a word line setup phase. For example, the nonvolatile memory device 100 may apply the junction word line erase voltage VERS_CWL to at least one of the first junction word line CWL1 and the second junction word line CWL2, based on the erase operations described with reference to FIGS. 4 to 10. The erase inhibit voltage Vinh may be applied to one, to which the junction word line erase voltage VERS_CWL is not applied, from among the first junction word line CWL1 and the second junction word line CWL2.

In operation S130, the nonvolatile memory device 100 may perform the erase phase. In an embodiment, the erase phase may indicate a time period where the nonvolatile memory device 100 maintains voltages of lines connected to the first memory block BLK1 at the voltages of the fourth time t4 described with reference to FIGS. 4 to 8 and 10. Memory cells or junction memory cells may be selectively erased depending on voltage levels of respective lines as described above, and thus, additional description will be omitted to avoid redundancy.

In operation S140, the nonvolatile memory device 100 may adjust a voltage of the junction word line CWL during the erase phase. For example, as described above, a target threshold voltage of the junction memory cells CMC1 and CMC2 may be higher than the upper limit of the threshold voltage distribution of the normal memory cells MC1 to MC4 of the erase state "E". That is, because the junction memory cells CMC1 and CMC2 need not be erased like the normal memory cells MC1 to MC4, the junction memory cells CMC1 and CMC2 may be prevented from being over-erased by increasing a voltage of the junction word line CWL as much as a given level. This is described with reference to FIG. 9, and thus, additional description will be omitted to avoid redundancy.

As described above, the nonvolatile memory device 100 according to an embodiment of the present disclosure may include a multi-stacked memory block or a multi-stacked memory structure. In this case, the nonvolatile memory device 100 may perform the erase operation on a junction word line placed at the junction portion of memory structures included in a memory block, thus making it possible to prevent an error from occurring due to a threshold voltage change of the junction memory cell connected to the junction word line in a read operation.

Figure 12:
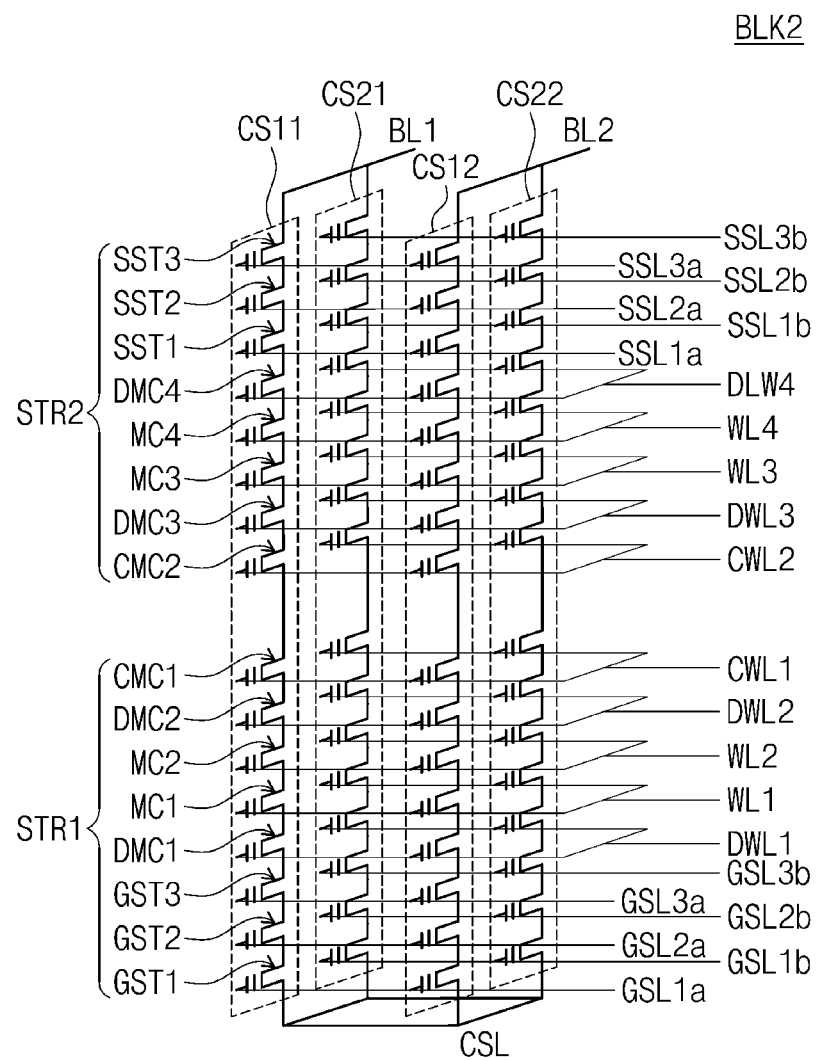
FIG. 12 is a circuit diagram illustrating a memory block included in a memory cell array of FIG. 1 according to example embodiments.

FIG. 12 is a circuit diagram illustrating a memory block included in a memory cell array of FIG. 1 according to example embodiments. For convenience of description, additional description associated with the components described above will be omitted to avoid redundancy. A second memory block BLK2 will be described with reference to FIG. 12, but the present disclosure is not limited thereto. A plurality of memory blocks included in the memory cell array 110 may have a structure that is similar to the structure of the second memory block BLK2.

Referring to FIG. 12, the second memory block BLK2 may include a plurality of cell strings CS11, CS12, CS21, and CS22. Each of the plurality of cell strings CS11, CS12, CS21, and CS22 may include a plurality of cell transistors. In each of the cell strings CS11, CS12, CS21, and CS22, the plurality of cell transistors may be connected in series between a relevant bit line (e.g., BL1 or BL2) and the common source line CSL.

In each of the cell strings CS11, CS12, CS21, and CS22, the plurality of cell transistors may include a plurality of ground selection transistors GST1, GST2, and GST3, a plurality of dummy memory cells DMC1, DMC2, DMC3, and DMC4, a plurality of junction memory cells CMC1 and CMC2, a plurality of memory cells MC1, MC2, MC3, and MC4, and a plurality of string selection transistors SST1, SST2, and SST3. In the cell strings CS11, CS12, CS21, and CS22, the plurality of ground selection transistors GST1, GST2, and GST3 may be respectively connected to a plurality of ground selection lines GSL1a, GSL2a, GSL3a, GSL1b, GSL2b, and GSL3b, the plurality of dummy memory cells DMC1, DMC2, DMC3, and DMC4 may be respectively connected to a plurality of dummy word lines DWL1, DWL2, DWL3, and DWL4, the plurality of memory cells MC1, MC2, MC3, and MC4 may be respectively connected to a plurality of word lines WL1, WL2, WL3, and WL4, the plurality of junction memory cells CMC1 and CMC2 may be respectively connected to a plurality of junction word lines CWL1 and CWL2, the plurality of string selection transistors SST1, SST2, and SST3 may be respectively connected to a plurality of string selection lines SSL1a, SSL2a, SSL3a, SSL1b, SSL2b, and SSL3b.

In an embodiment, in each of the cell strings CS11, CS12, CS21, and CS22, the first dummy memory cell DMC1 may be placed between the ground selection transistors GST1 to GST3 and the first memory cell MC1, and the second dummy memory cell DMC2 may be placed between the second memory cell MC2 and the first junction memory cell CMC1. In each of the cell strings CS11, CS12, CS21, and CS22, the third dummy memory cell DMC3 may be placed between the second junction memory cell CMC2 and the third memory cell MC3, and the fourth dummy memory cell DMC4 may be placed between the fourth memory cell MC4 and the string selection transistors SST1 to SST3. In an embodiment, the dummy memory cells DMC1 to DMC4 may be memory cells that do not store actual data (or, user data).

The second memory block BLK2 may have a multi-stacked structure, and the second memory block BLK2 may include a first structure STR1 and a second structure STR2. The first structure STR1 may include the plurality of ground selection transistors GST1 to GST3, the first and second dummy memory cells DMC1 and DMC2, the first and second memory cells MC1 and MC2, and the first junction memory cell CMC1. The second structure STR2 may include the plurality of string selection transistors SST1 to SST3, the third and fourth dummy memory cells DMC3 and DMC4, the third and fourth memory cells MC3 and MC4, and the second junction memory cell CMC2.

A structure of the second memory block BLK2 of FIG. 12 is similar to the structure of the first memory block BLK1 of FIG. 2 except that the number of ground selection transistors and the number of string selection transistors increase and the dummy memory cells DMC1 to DMC4 are added, and thus, additional description will be omitted to avoid redundancy.

Figure 13:
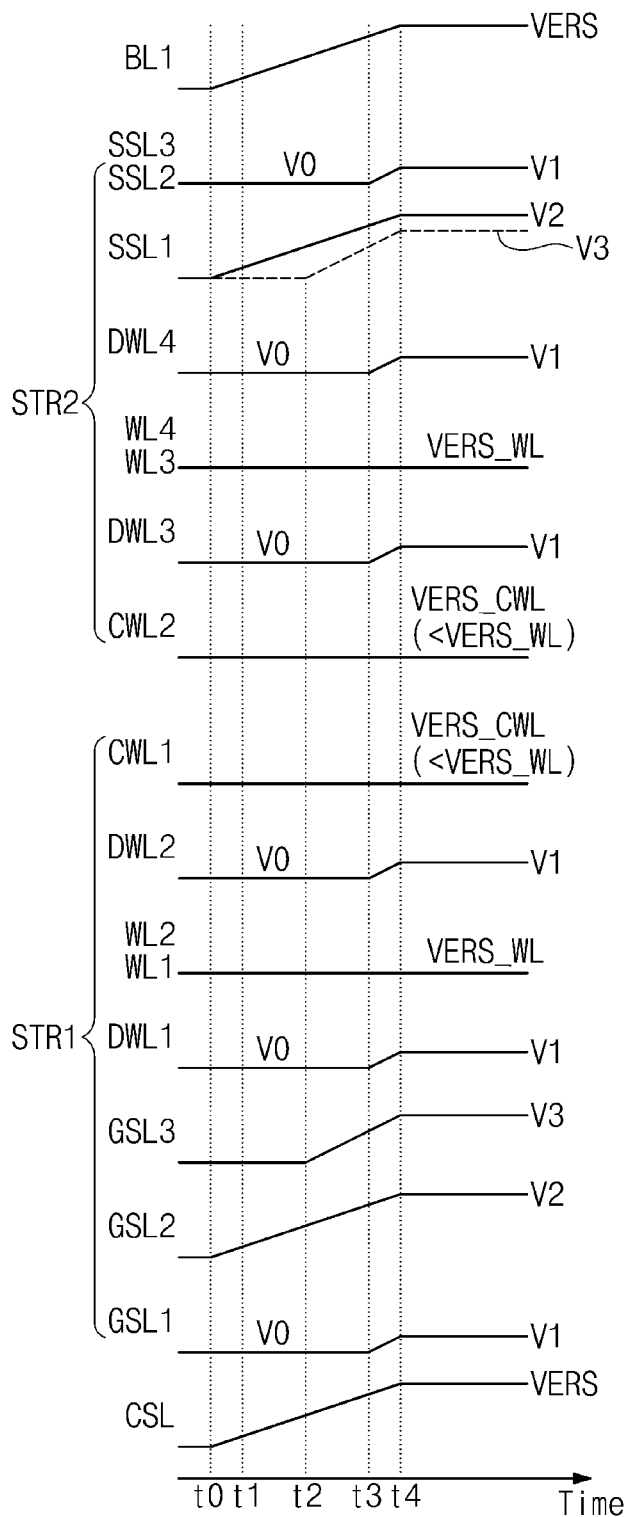
FIG. 13 is a timing diagram illustrating an erase operation of a second memory block of FIG. 12 according to example embodiments.

FIG. 13 is a timing diagram illustrating an erase operation of a second memory block of FIG. 12 according to example embodiments. For convenience of description, additional description associated with the components described above will be omitted to avoid redundancy. Referring to FIGS. 1, 12, and 13, the nonvolatile memory device 100 may maintain a voltage of the first to fourth dummy word lines DWL1 to DWL4 at the 0-th voltage V0 from the 0-th time t0 to the third time t3 and may float the first to fourth dummy word lines DWL1 to DWL4 at the third time t3. In this case, the voltage of the first to fourth dummy word lines DWL1 to DWL4 may increase to the first voltage V1.

The nonvolatile memory device 100 may maintain a voltage of the third ground selection line GSL3 at the 0-th voltage V0 from the 0-th time t0 to the second time t2 and may float the third ground selection line GSL3 at the second time t2. In this case, the third ground selection line GSL3 may increase to the third voltage V3.

The nonvolatile memory device 100 may control the third string selection line SSL3 under the same biasing condition as the second string selection line SSL2. Voltage levels of the first bit line BL1, the common source line CSL, the first to fourth word lines WL1 to WL4, the first and second ground selection lines GSL1 and GSL2, the first and second string selection lines SSL1 and SSL2, and the first and second junction word lines CWL1 and CWL2 are identical to those described with reference to FIG. 6, and thus, additional description will be omitted to avoid redundancy.

The nonvolatile memory device 100 may perform the erase operation on junction word lines and normal word lines of the second memory block BLK2 by controlling each line based on the biasing condition illustrated in FIG. 13. The erase operation that is performed on junction word lines and normal word lines of the second memory block BLK2 is described with reference to FIG. 13, but the present disclosure is not limited thereto. For example, depending on an erase target, voltages of normal word lines and junction word lines may be controlled based on the method described with reference to FIGS. 4 to 10.

Figure 14:
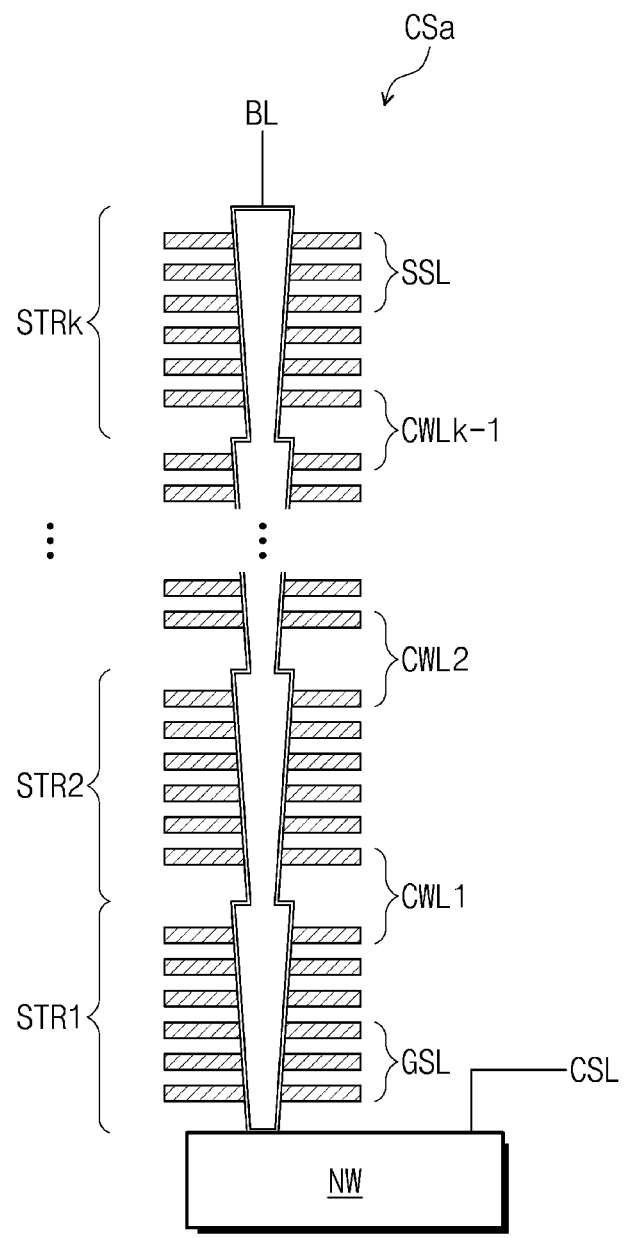
FIG. 14 is a vertical cross-sectional view of a cell string included in a memory block according to an embodiment of the present disclosure.

FIG. 14 is a vertical cross-sectional view of a cell string included in a memory block according to an embodiment of the present disclosure. In the above embodiments, the erase operation that is performed on the memory block BLK1 or BLK2 having a two-layer stacked structure is described, but the present disclosure is not limited thereto. For example, a memory block included in the nonvolatile memory device 100 according to an embodiment of the present disclosure may have a k-layer stacked structure.

Referring to FIG. 14, a cell string CSa of the memory block may include a plurality of structures STR1 to STRk formed on the N-well of the substrate. Ground selection lines GSL may be formed at a lower portion of the first structure STR1 adjacent to the substrate, and string selection lines SSL may be formed at an upper portion of the k-th structure STRk adjacent to a bit line BL.

Junction word lines CWL may be formed at the junctions of the plurality of structures STR1 to STRk. For example, word lines, which are adjacent to the junction of the first and second structures STR1 and STR2, from among word lines of the first and second structures STR1 and STR2 may be junction word lines CWL1. Likewise, word lines adjacent to the junctions of the remaining structures STR2 to STRk may be junction word lines CWL2 and CWLk−1.

In an embodiment, the nonvolatile memory device 100 may perform the erase operation on at least one of the junction word lines CWL1 to CWLk−1 depending on the embodiments described above.

As described above, the nonvolatile memory device 100 according to an embodiment of the present disclosure may include a memory block of a multi-stacked structure. The nonvolatile memory device 100 may perform the erase operation on the memory block of the multi-stacked structure. In this case, the nonvolatile memory device 100 may perform the erase operation on a junction word line by applying a junction word line erase voltage smaller than a word line erase voltage to junction word lines adjacent to the junction of stacked structures. Accordingly, in the read operation of the nonvolatile memory device 100, there may be prevented a read error due to a threshold voltage change of junction memory cells connected to the junction word line.

Voltage levels described or marked in the above embodiments are examples for describing the present disclosure easily, and the present disclosure is not limited thereto. That is, in drawings or the detailed description, a voltage level marked by the same reference sign may be associated with the same voltage but may be variously changed without departing from the scope and spirit of the present disclosure.

Figure 15:
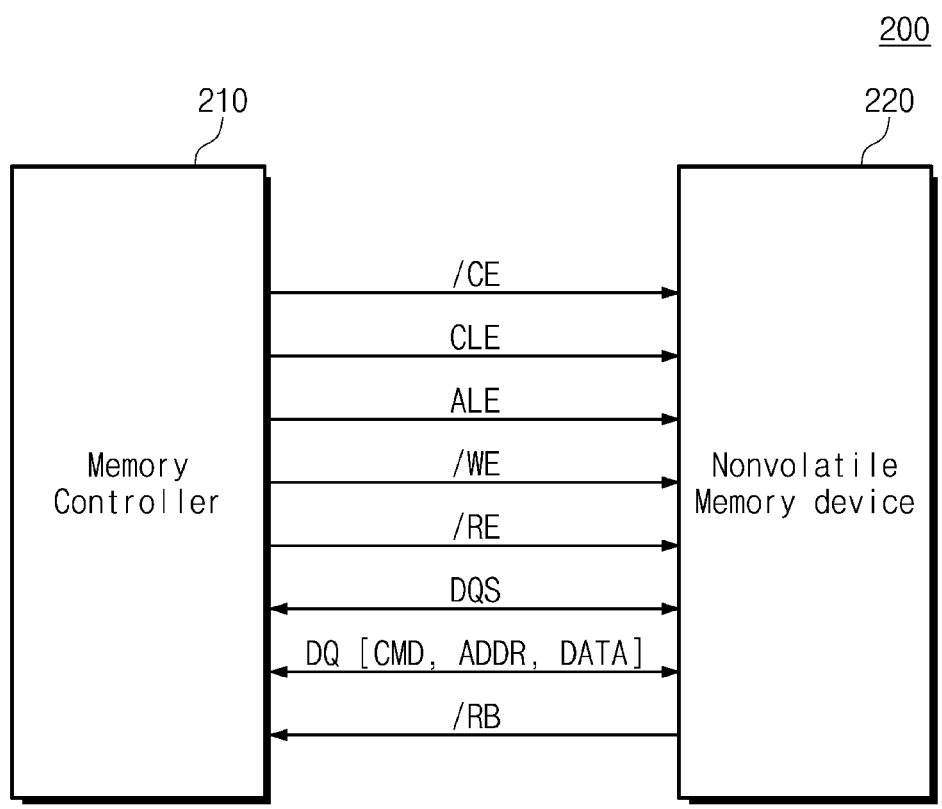
FIG. 15 is a block diagram illustrating a storage device according to an embodiment of the present disclosure.

FIG. 15 is a block diagram illustrating a storage device according to an embodiment of the present disclosure. Referring to FIG. 15, a storage device 200 may include a memory controller 210 and a nonvolatile memory device 220.

The memory controller 210 may control the nonvolatile memory device 220. The memory controller 210 may transmit a command CMD, an address ADDR, and various control signals to the nonvolatile memory device 220 and may exchange data "DATA" with the nonvolatile memory device 220. For example, the control signals may include a chip enable signal /CE, a command latch enable signal CLE, an address latch enable signal ALE, a write enable signal /WE, and a read enable signal/RE. The command CMD, the address ADDR, and the data "DATA" may be transmitted/received through data signal DQ.

The nonvolatile memory device 220 may recognize the command CMD provided through the data signal DQ based on the command latch enable signal CLE and the write enable signal /WE and may recognize the address ADDR provided through the data signal DQ based on the address latch enable signal ALE and the write enable signal /WE. The data "DATA" may be transmitted/received through the data signal DQ in synchronization with a data strobe signal DQS.

The nonvolatile memory device 220 may transmit a ready/busy signal /RB indicating information about an operation state to the memory controller 210. The memory controller 210 may determine the operation state (i.e., whether the nonvolatile memory device 220 is in a ready state or a busy state), based on the ready/busy signal /RB.

The above communication between the memory controller 210 and the nonvolatile memory device 220 may be based on a toggle interface, but the present disclosure is not limited thereto. For example, the memory controller 210 and the nonvolatile memory device 220 may communicate with each other through an open NAND flash interface (ONFI) or any other interface.

In an embodiment, the nonvolatile memory device 220 may include the nonvolatile memory device 100 described with reference to FIGS. 1 to 14 or may perform the erase operation based on the embodiments described with reference to FIGS. 1 to 14.

Figure 16A:
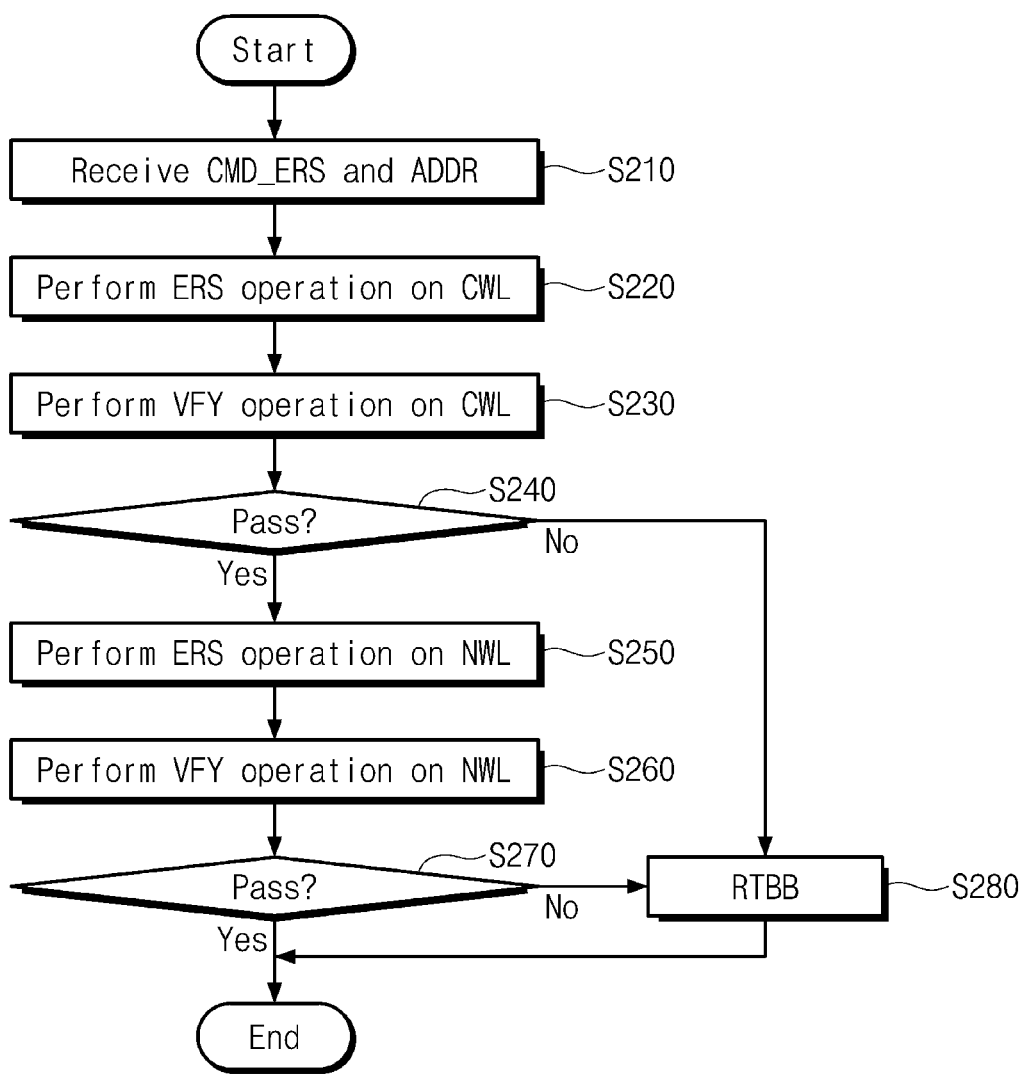
FIGS. 16A to 16C are flowcharts illustrating erase operations of a nonvolatile memory device of FIG. 15 according to example embodiments.
Figure 16B:
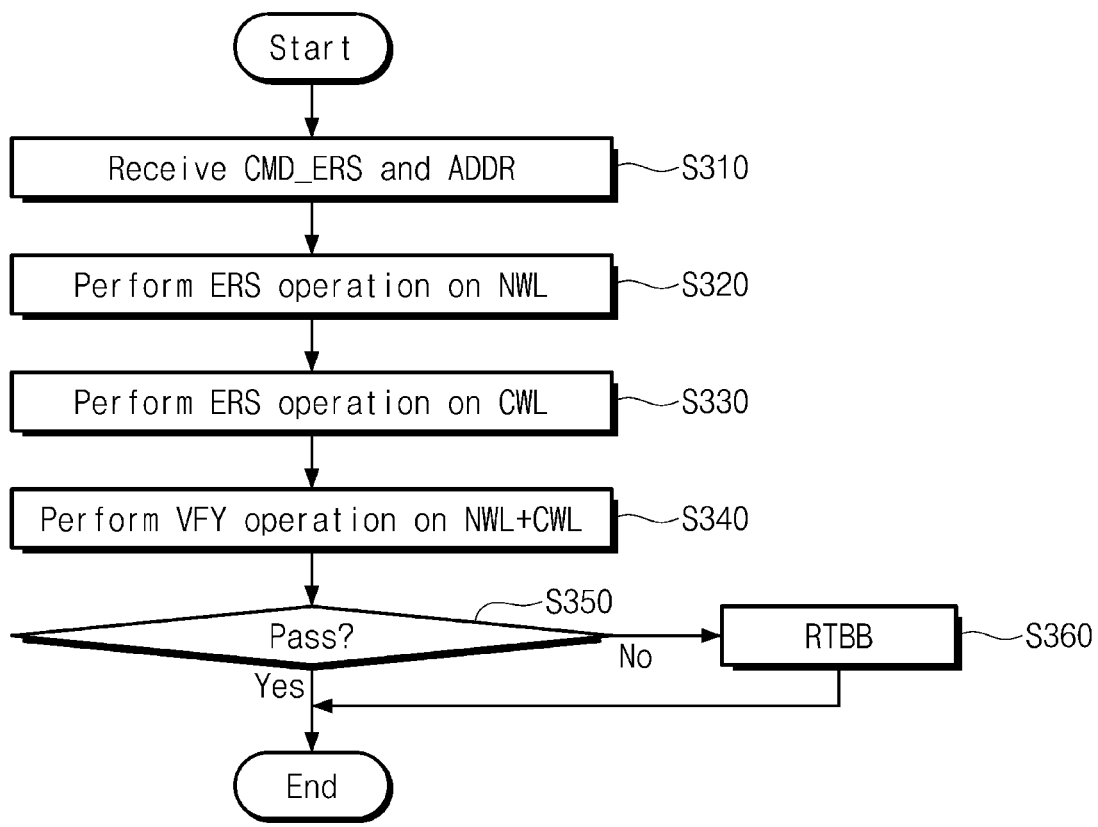
Figure 16C:
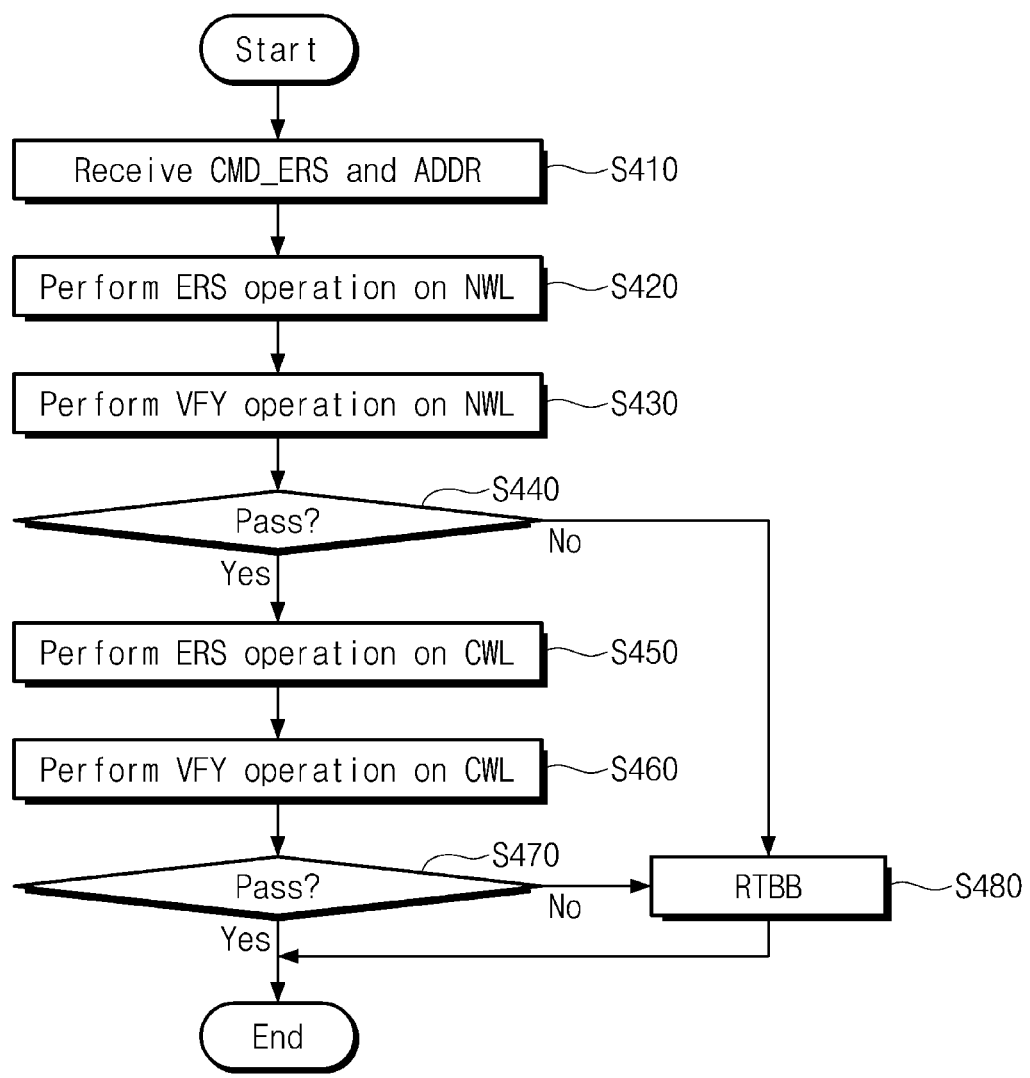

FIGS. 16A to 16C are flowcharts illustrating erase operations of a nonvolatile memory device of FIG. 15 according to example embodiments. For convenience of description, additional description associated with the components described above will be omitted to avoid redundancy.

Below, for convenience of description, it is assumed that the nonvolatile memory device 220 performs the erase operation on a memory block corresponding to the address ADDR received from the memory controller 210. In this case, it should be understood that a memory block may include one memory block or two or more memory blocks. Alternatively, it should be understood that a memory block includes at least one of a plurality of sub-blocks included in one memory block.

The erase operation that is performed on the memory block may include an erase operation that is performed on a junction word line, an erase operation that is performed on a junction word line and a normal word line, and an erase operation that is performed on a normal word line. The erase operation that is performed on a junction word line, as described with reference to FIG. 10, may indicate an erase operation that is performed only on junction word lines of a selected memory block. The erase operation that is performed on a junction word line and a normal word line, as described with reference to FIG. 9, may indicate an erase operation that is performed on at least one junction word line and normal word lines of the selected memory block. The erase operation that is performed on normal word lines, as described with reference to FIG. 4, may indicate an erase operation that is performed only on the normal word lines of the selected memory block. Below, for convenience of description, the erase operation that is performed on a junction word line is referred to as a "junction erase operation", the erase operation that is performed on a junction word line and a normal word line is referred to as a "junction/normal erase operation", and the erase operation that is performed on a normal word line is referred to as a "normal erase operation".

Below, for convenience of description, voltages that are applied to the selected memory block in the junction erase operation, the junction/normal erase operation, and the normal erase operation are described above, and thus, additional description will be omitted to avoid redundancy.

Referring to FIGS. 15 and 16A, in operation S210, the nonvolatile memory device 220 may receive an erase command CMD_ERS and the address ADDR. For example, the memory controller 210 may perform the erase operation on a specific memory block of the nonvolatile memory device 220 during various maintenance operations. For example, the erase command CMD_ERS may be an explicit erase command received from the memory controller 210.

In operation S220, the nonvolatile memory device 220 may perform the junction erase operation. For example, the nonvolatile memory device 220 may select a memory block corresponding to the received address ADDR. The nonvolatile memory device 220 may perform the erase operation (i.e., the junction erase operation) on junction word lines CWL of the selected memory block. In one embodiment, in operation S220, the nonvolatile memory device 220 does not perform the erase operation (i.e., the normal erase operation) on the normal word lines NWL of the selected memory block. In an embodiment, the nonvolatile memory device 220 may not perform the normal erase operation by applying the erase inhibit voltage Vinh to the normal word lines NWL.

In operation S230, the nonvolatile memory device 220 may perform a verification operation on the junction word lines CWL. For example, as described with reference to FIG. 5, junction memory cells CMC connected to the junction word line CWL are set to form the specific threshold voltage distribution CC. In this case, whether the junction memory cells CMC form the specific threshold voltage distribution CC through the junction erase operation in operation S210 may be verified. The verification operation (hereinafter referred to as a "junction verification operation") may be performed by applying a voltage (hereinafter referred to as a "junction verification voltage") corresponding to the upper limit of the specific threshold voltage distribution CC to the junction word lines CWL and applying a pass voltage to the remaining word lines.

In operation S240, the nonvolatile memory device 220 may perform whether the junction verification operation is successful (i.e., whether a result of the junction verification operation indicates a pass). For example, the nonvolatile memory device 220 may perform whether an off cell is detected in the junction verification operation in operation S230. When an off cell is not detected (i.e., Yes in operation S240), in operation S250, the nonvolatile memory device 220 may perform the normal erase operation. In operation S260, the nonvolatile memory device 220 may perform a verification operation on normal word lines. In one embodiment, in operation S250, the nonvolatile memory device 220 does not perform the junction erase operation on the junction word lines CWL of the selected memory block. In an embodiment, the nonvolatile memory device 220 may not perform the junction erase operation by applying the erase inhibit voltage Vinh to the junction word lines CWL.

In an embodiment, a level of a verification voltage used in the verification operation in operation S230 and a level of a verification voltage used in the verification operation in operation S260 may be different. For example, because the verification operation in operation S230 is performed before the erase operation associated with normal word lines, a pass voltage (e.g., Vread in FIG. 5) may be applied to the normal word lines. In contrast, because the verification operation in operation S260 is performed to verify whether the erase operation performed on the normal word lines is successful, an erase verification voltage (e.g., having a level corresponding to an upper limit of a threshold voltage distribution of the erase state "E") may be applied to the normal word lines. In an example embodiment, a voltage level of the erase verification voltage may be smaller than a voltage level of the junction verification voltage.

In operation S270, the nonvolatile memory device 220 may perform whether a result of the verification operation performed on the normal word lines (hereinafter referred to as a "normal verification operation") indicates a pass. When the result of the normal verification operation indicates a pass, the erase operation is terminated.

In an embodiment, when the verification result in operation S240 or the verification result in operation S260 does not indicate a pass, in operation S280, the nonvolatile memory device 220 may process the selected memory block as a run-time bad block (RTBB). In an embodiment, the processing of the run-time bad block (RTBB) may be performed at the nonvolatile memory device 220. Alternatively, the nonvolatile memory device 220 may transmit fail information about the erase operation of the selected memory block to the memory controller 210, and the memory controller 210 may perform RTBB processing based on the fail information. In this case, the RTBB processing may be performed at a flash translation layer (FTL) of the memory controller 210.

In an embodiment, when the verification result in operation S240 does not indicate a pass, the nonvolatile memory device 220 may iteratively perform operation S220 to operation S240 until a verification result indicates a pass. The iterative operation may be performed as much as the given number of times. Even though the iterative operation is performed as much as the given number of times, when the verification result does not indicate a pass, operation S280 may be performed. In an embodiment, as the number of iterative operations increases, a magnitude of the erase voltage VERS that is provided to the common source line CSL or the bit line BL may increase, or a magnitude of the junction word line erase voltage VERS_CWL that is provided to junction word lines may decrease.

In an embodiment, when the verification result in operation S260 does not indicate a pass, the nonvolatile memory device 220 may iteratively perform operation S250 to operation S270 until a verification result indicates a pass. The iterative operation may be performed as much as the given number of times. Even though the iterative operation is performed as much as the given number of times, when the verification result does not indicate a pass, operation S280 may be performed. In an embodiment, as the number of iterative operations increases, a magnitude of the erase voltage VERS that is provided to the common source line CSL or the bit line BL may increase, or a magnitude of the word line erase voltage VERS_WL that is provided to normal word lines may decrease.

Next, referring to FIGS. 15 and 16B, the nonvolatile memory device 220 may perform operation S310, operation S320, and operation S330. Operation S310, operation S320, and operation S330 are similar to operation S210, operation S250, and operation S220 of FIG. 16A, and thus, additional description will be omitted to avoid redundancy.

In operation S340, the nonvolatile memory device 220 may perform a verification operation on junction word lines and normal word lines. For example, the nonvolatile memory device 220 may perform the verification operation by applying an erase verification voltage to normal word lines of the selected memory block and applying a junction verification voltage to junction word lines thereof.

In operation S350, the nonvolatile memory device 220 may determine whether a verification result indicates a pass. When the verification result indicates a pass, the erase operation is terminated. When the verification result does not indicate a pass, in operation S360, the nonvolatile memory device 220 may process the selected memory block as an RTBB. Operation S360 is similar to operation S280 of FIG. 16A, and thus, additional description will be omitted to avoid redundancy.

In an embodiment, when the verification result in operation S350 does not indicate a pass, the nonvolatile memory device 220 may iteratively perform operation S320 to operation S350 until a verification result indicates a pass. The iterative operation may be performed as much as the given number of times. Even though the iterative operation is performed as much as the given number of times, when the verification result does not indicate a pass, operation S360 may be performed.

In an embodiment, an order of the normal erase operation in operation S320 and the junction erase operation in operation S330 may be changed. For example, as illustrated in FIG. 16B, the normal erase operation in operation S320 may be performed, and then, the junction erase operation in operation S330 may be performed. Alternatively, the junction erase operation in operation S330 may be performed, and then, the normal erase operation in operation S320 may be performed.

Operation S320 and operation S330 may be performed in one erase phase. For example, the nonvolatile memory device 220 may perform the junction/normal erase operation based on the erase method described with reference to FIGS. 6 to 9.

Referring to FIG. 16C, the nonvolatile memory device 220 may perform operation S410 to operation S480. Operation S410 of FIG. 16C corresponds to operation S210 of FIG. 16A, operation S420 of FIG. 16C corresponds to operation S250 of FIG. 16A, and operation S430 of FIG. 16C corresponds to operation S260 of FIG. 16A. Also, operation S440 of FIG. 16C corresponds to operation S270 of FIG. 16A, operation S450 of FIG. 16C corresponds to operation S220 of FIG. 16A, operation S460 of FIG. 16C corresponds to operation S230 of FIG. 16A, and operation S470 of FIG. 16C corresponds to operation S240 of FIG. 16A.

For example, the embodiment of FIG. 16C may be similar to the embodiment of FIG. 16A except that the normal erase operation and the normal verification operation are first performed and the junction erase operation and the junction verification operation are then performed.

As described above, the nonvolatile memory device 220 according to an embodiment of the present disclosure may perform the junction erase operation, the normal erase operation, or the junction/normal erase operation in response to the erase command CMD_ERS from the memory controller 210. In this case, because an increase in threshold voltages of junction memory cells connected to junction word lines is prevented, the reliability of the nonvolatile memory device 220 is improved.

Figure 17:
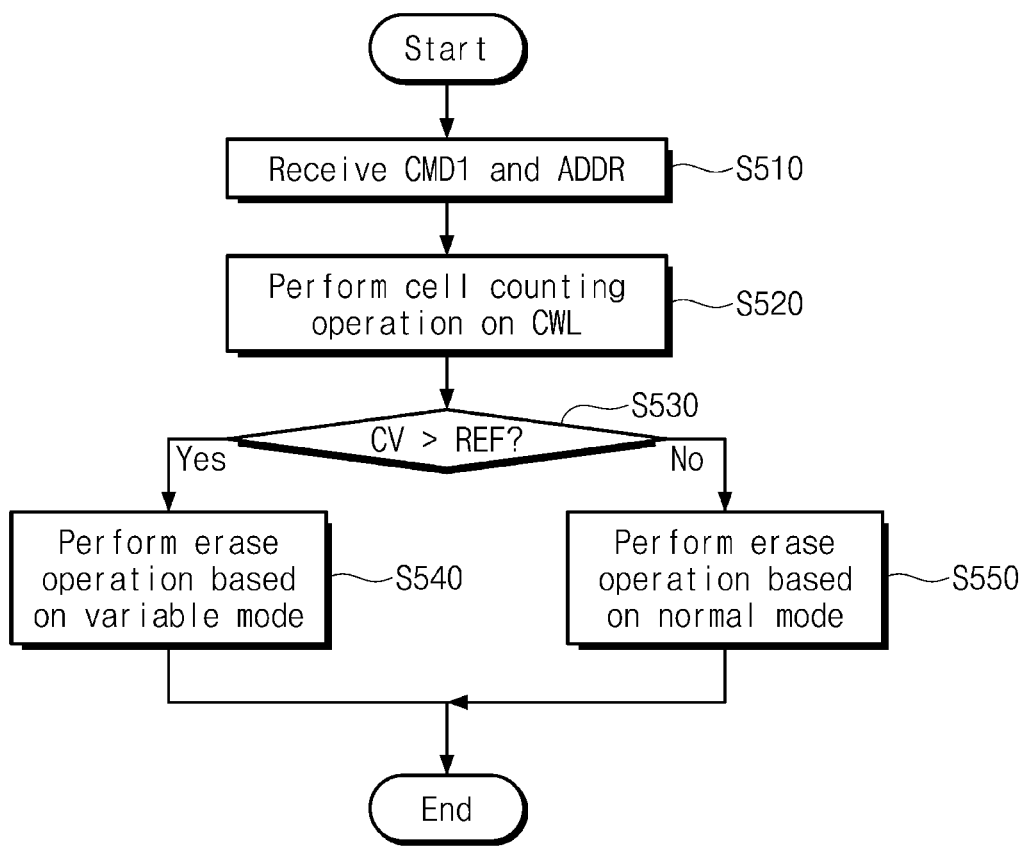
FIG. 17 is a flowchart illustrating an operation of a nonvolatile memory device of FIG. 15 according to example embodiments.

FIG. 17 is a flowchart illustrating an operation of a nonvolatile memory device of FIG. 15 according to example embodiments. Referring to FIGS. 15 and 17, in operation S510, the nonvolatile memory device 220 may receive a first command CMD1 and the address ADDR. The first command CMD1 may be a read command for a junction word line of a selected memory block corresponding to the address ADDR.

In operation S520, the nonvolatile memory device 220 may perform a cell counting operation on the junction word line. For example, the nonvolatile memory device 220 may perform a cell counting operation on junction memory cells connected to the junction word line under the following biasing condition and may generate a cell counting value CV: applying the junction word line pass voltage Vread_cwl (refer to FIG. 5) to the junction word lines of the selected memory block corresponding to the address ADDR and applying the pass voltage Vread (refer to FIG. 5) to normal word lines. In an embodiment, the cell counting value CV may indicate the number of memory cells each having a threshold voltage greater than the junction word line pass voltage Vread_cwl from among the junction memory cells.

In operation S530, the nonvolatile memory device 220 may determine whether the cell counting value CV is greater than a reference value REF. The cell counting value CV is greater than the reference value REF means that the probability that a read error due to junction memory cells occurs is high. In this case, in operation S540, the nonvolatile memory device 220 may perform the erase operation based on a variable mode. In an embodiment, in operation S540, the nonvolatile memory device 220 may receive a first erase command CMD_ERS1 and the address ADDR. In an embodiment, the erase operation based on the variable mode may indicate one of the normal erase operation, the junction erase operation, and the junction/normal erase operation described with reference to FIGS. 16A to 16C. For example, when the cell counting value CV is greater than the reference value REF, the nonvolatile memory device 220 may perform the erase operation on junction word lines.

When the cell counting value CV is not greater than the reference value REF, in operation S550, the nonvolatile memory device 220 may perform the erase operation based on a normal mode. For example, the erase operation based on the normal mode may indicate the normal erase operation (i.e., the erase operation described with reference to FIG. 4). In an embodiment, in operation S550, the nonvolatile memory device 220 may receive a second erase command CMD_ERS2 and the address ADDR.

As described above, before performing the erase operation, the nonvolatile memory device 220 may perform a cell counting operation on junction word lines of a selected memory block and may selectively perform the erase operation on the junction word lines based on a result of the cell counting operation.

Figure 18:
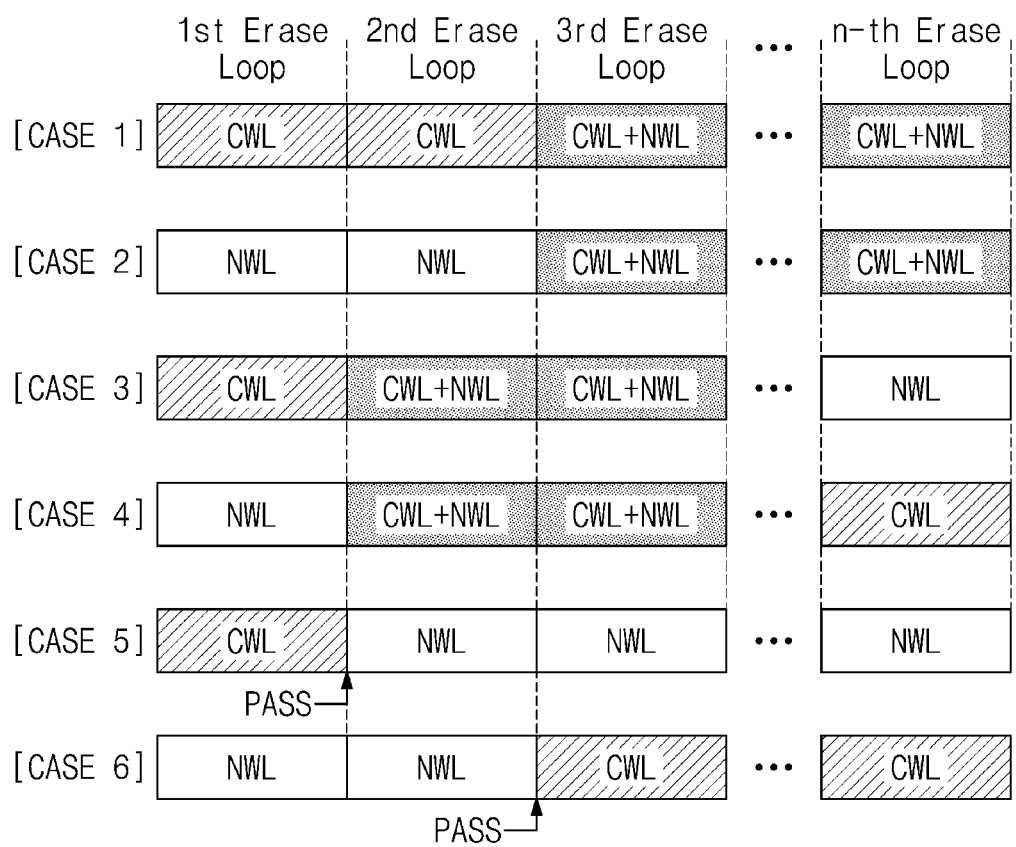
FIG. 18 is a diagram for describing operation S540 of FIG. 17 according to example embodiments.

FIG. 18 is a diagram for describing operation S540 of FIG. 17 according to example embodiments. In an embodiment, the erase operation based on a variable mode in operation S540 may be performed based on the erase methods described with reference to FIGS. 16A to 16C. Alternatively, the erase operation based on the variable mode may be performed in various manners. For example, as illustrated in FIG. 18, the erase operation may be performed through a plurality of erase loops. For example, the plurality of erase loops may include first to n-th erase loops, n is a natural number. One erase loop may include step of erasing normal memory cells or junction memory cells and step of verifying the erased normal memory cells or the erased junction memory cells.

Below, for convenience of description, it is assumed that a junction erase loop indicates an erase loop in which junction memory cells connected to a junction word line(s) are erased and verified, a junction/normal erase loop indicates an erase loop in which junction memory cells connected to a junction word line(s) and normal memory cells connected to normal word lines are erased and verified, and a normal erase loop indicates an erase loop in which normal memory cells associated with normal word lines are erased and verified.

In CASE 1, initial erase loops (e.g., first and second erase loops) may correspond to the junction erase loop, and the remaining erase loops (e.g., third to n-th erase loops) may correspond to the junction/normal erase loop. In this case, the number of initial erase loops may be determined in advance.

In CASE 2, initial erase loops (e.g., the first and second erase loops) may correspond to the normal erase loop, and the remaining erase loops (e.g., the third to n-th erase loops) may correspond to the junction/normal erase loop. In this case, the number of initial erase loops may be determined in advance.

In CASE 3, an initial erase loop (e.g., the first erase loop) may correspond to the junction erase loop, some (e.g., the second to (n−1)-th erase loops) of the remaining erase loops may correspond to the junction/normal erase loop, and the other erase loop (e.g., the n-th erase loop) may correspond to the normal erase loop.

In CASE 4, an initial erase loop (e.g., the first erase loop) may correspond to the normal erase loop, some erase loops (e.g., the second to (n−1)-th erase loops) may correspond to the junction/normal erase loop, and the other erase loops (e.g., the n-th erase loop) may correspond to the junction erase loop.

In CASE 5, an initial erase loop may correspond to the junction erase loop and may be performed until the junction erase loop is determined as pass, and the other erase loops may correspond to the normal erase loop.

In CASE 6, an initial erase loop may correspond to the normal erase loop and may be performed until the normal erase loop is determined as a pass, and the other erase loops may correspond to the junction erase loop.

For example, in the erase operation based on the variable mode, a plurality of erase loops constituting one erase operation may be combined in various manners. In an embodiment, in the above cases, when both a result of the junction verification operation and a result of the normal verification operation indicate a pass, the remaining erase loops may not be performed. In an embodiment, during the junction/normal erase loop, the junction verification operation and the normal verification operation may be performed simultaneously or individually.

In the case where the junction verification operation and the normal verification operation are performed individually, memory cells of a word line passing the verification operation of a specific erase loop may be erase-inhibited in erase loops following the specific erase loop. For example, in CASE 3, in the case where junction memory cells of a junction word line pass the verification operation in the second erase loop, the junction/normal erase loop corresponding to the third erase loop may be replaced with the normal erase loop.

CASE 1 to CASE 6 described above may be some examples and may be variously changed or modified without departing from the technical idea of the present disclosure.

Figure 19:
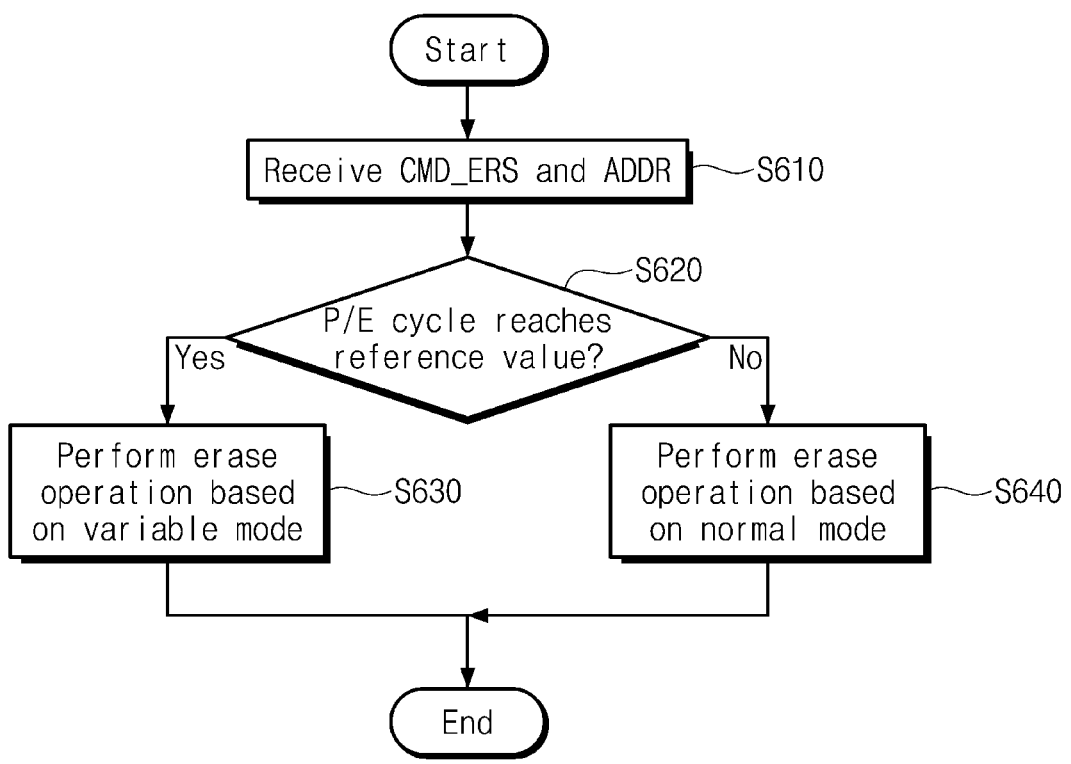
FIG. 19 is a flowchart illustrating an erase operation of a nonvolatile memory device of FIG. 15 according to example embodiments.

FIG. 19 is a flowchart illustrating an erase operation of a nonvolatile memory device of FIG. 15 according to example embodiments. Referring to FIGS. 15 and 19, in operation S610, the nonvolatile memory device 220 may receive the erase command CMD_ERS and the address ADDR.

In operation S620, the nonvolatile memory device 220 may determine whether the number of program/erase cycles of a selected memory block corresponding to the address ADDR reaches a reference value. In an embodiment, the reference value may indicate a numerical value indicating a specific program/erase cycle. For example, the reference value may be "a", "b", "c", and "d" (a<b<c<d), and the nonvolatile memory device 220 may determine whether the number of program/erase cycles reaches "a", "b", "c", or "d".

When the number of program/erase cycles reaches the reference value, the nonvolatile memory device 220 may perform operation S630; when the number of program/erase cycles does not reach the reference value, the nonvolatile memory device 220 may perform operation S640. Operation S630 is similar to operation S540 of FIG. 17 and thus, additional description will be omitted to avoid redundancy. Also, operation S640 is similar to operation S550 of FIG. 17, and thus, additional description will be omitted to avoid redundancy.

As described above, the nonvolatile memory device 220 may perform the junction erase operation on the selected memory block whenever the number of program/erase cycles of the selected memory block reaches the reference value. For example, because the junction erase operation is not performed every erase operation, the overhead due to the junction erase operation may decrease, and a read error due to an increase in threshold voltages of junction memory cells may be prevented.

As described above, the nonvolatile memory device 220 according to an embodiment of the present disclosure may perform the erase operation on junction word lines of a memory block based on various manners.

Figure 20:
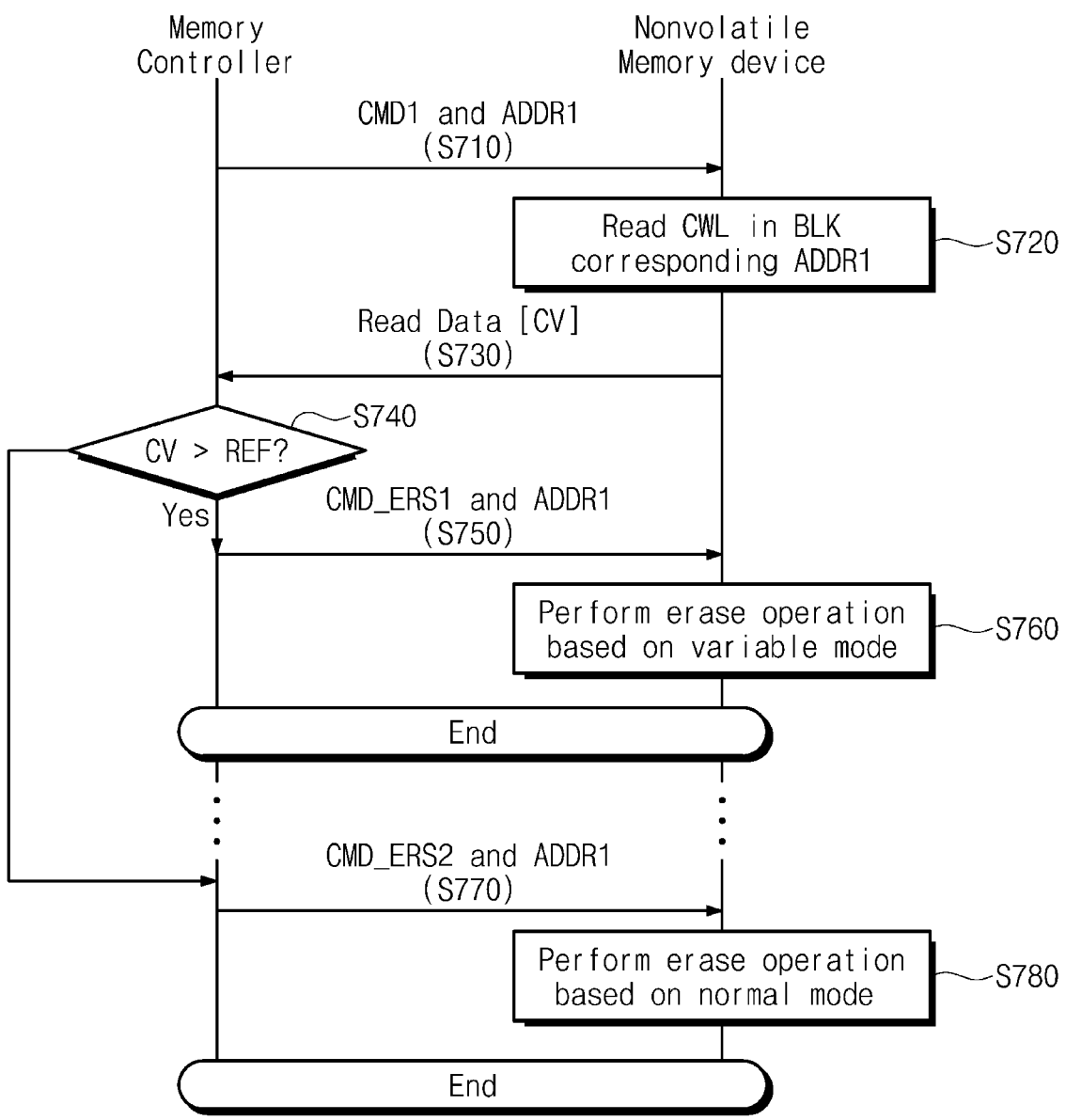
FIG. 20 is a flowchart illustrating an operation of a storage device of FIG. 15 according to example embodiments.

FIG. 20 is a flowchart illustrating an operation of a storage device of FIG. 15 according to example embodiments. In an embodiment, in the embodiments described with reference to FIGS. 16A to 16C and 17 to 19, the description is given as whether a junction erase operation is used to determine at the nonvolatile memory device 220 (i.e., components associated with the disclosure of the junction erase operation being implemented at the nonvolatile memory device 220 in the form of an on-chip), but the present disclosure is not limited thereto. For example, the nonvolatile memory device 220 may perform the junction erase operation based on an explicit request of the memory controller 210.

For example, referring to FIGS. 15 and 20, in operation S710, the memory controller 210 may transmit a first command CMD1 and a first address ADDR1 to the nonvolatile memory device 220. The first command CMD1 may be a read command for a junction word line of a selected memory block corresponding to the first address ADDR1.

In operation S720, the nonvolatile memory device 220 may perform a read operation on the junction word line of the selected memory block corresponding to the first address ADDR1 in response to the first command CMD1. In operation S730, the nonvolatile memory device 220 may transmit read data to the memory controller 210. In an embodiment, the read operation that is performed on the junction word line in operation S720 may be similar to the cell counting operation that is performed on a junction word line in operation S520 of FIG. 17. For example, the data read in operation S720 may include the cell counting value CV.

In operation S740, the memory controller 210 may compare the cell counting value CV to the reference value REF.

When the cell counting value CV is greater than the reference value REF, in operation S750, the memory controller 210 may transmit a first erase command CMD_ERS1 and the first address ADDR1 to the nonvolatile memory device 220. In operation S760, the nonvolatile memory device 220 may perform an erase operation on the selected memory block corresponding to the first address ADDR1 in response to the first erase command CMD_ERS1. In this case, the nonvolatile memory device 220 may perform the erase operation based on the variable mode. In an embodiment, operation S760 is similar to operation S540 of FIG. 17, and thus, additional description will be omitted to avoid redundancy.

When the cell counting value CV is not greater than the reference value REF, in operation S770, the memory controller 210 may transmit a second erase command CMD_ERS2 and the first address ADDR1 to the nonvolatile memory device 220. In operation S780, the nonvolatile memory device 220 may perform an erase operation on the selected memory block corresponding to the first address ADDR1 in response to the second erase command CMD_ERS2. In this case, the nonvolatile memory device 220 may perform the erase operation based on the normal mode. In an embodiment, operation S780 is similar to operation S550 of FIG. 17, and thus, additional description will be omitted to avoid redundancy.

As described above, the memory controller 210 may determine a scheme to erase a specific memory block based on a cell counting value associated with a junction word line of the specific memory block. The memory controller 210 may transmit an erase command corresponding to the determined erase scheme to the nonvolatile memory device 220.

In an embodiment, the memory controller 210 may manage program/erase counts of memory blocks included in the nonvolatile memory device 220. In the case where the number of program/erase cycles (or a program/erase count) of a specific memory block reaches a reference value, the memory controller 210 may perform an erase operation on the specific memory block based on the operation (or the method or process) according to the flowchart of FIG. 20.

Figure 21:
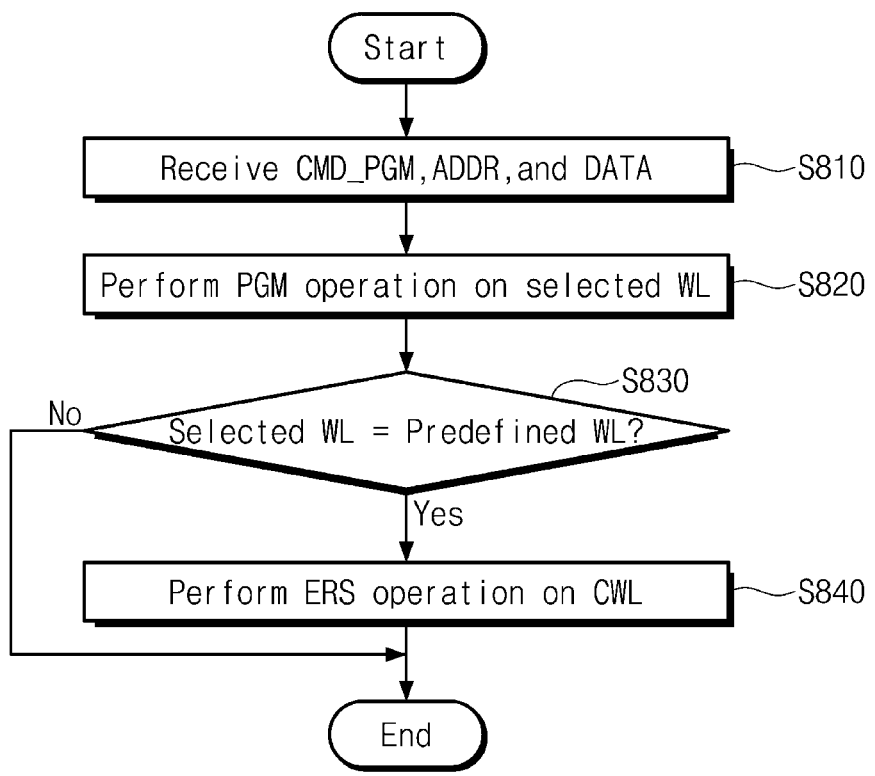
FIG. 21 is a flowchart illustrating an operation of a nonvolatile memory device of FIG. 15 according to example embodiments.

FIG. 21 is a flowchart illustrating an operation of a nonvolatile memory device of FIG. 15 according to example embodiments. FIG. 22 is a diagram for describing an operation according to the flowchart of FIG. 21 according to example embodiments. Referring to FIGS. 15, 21, and 22, in operation S810, the nonvolatile memory device 220 may receive a program command CMD_PGM, the address ADDR, and the data "DATA". In operation S820, the nonvolatile memory device 220 may store the data "DATA" by performing a program operation on a selected word line (e.g., a selected normal word line) corresponding to the address ADDR.

In operation S830, the nonvolatile memory device 220 may determine whether the selected word line is a predefined word line.

When it is determined that the selected word line is the predefined word line, in operation S840, the nonvolatile memory device 220 may perform the junction erase operation, for example, an erase operation associated with a junction word line. The junction erase operation is described with reference to FIG. 10, and thus, additional description will be omitted to avoid redundancy.

As described above, the nonvolatile memory device 220 may perform the junction erase operation after a program operation associated with a specific word line is performed. For example, as illustrated in FIG. 22, it is assumed that a specific memory block includes first to eighth word lines WL1 to WL8 and first and second junction word lines CWL1 and CWL2. In this case, a program sequence may be as follows: eighth word line programming WL8 PGM, seventh word line programming WL7 PGM, sixth word line programming WL6 PGM, fifth word line programming WL5 PGM, fourth word line programming WL4 PGM, third word line programming WL3 PGM, second word line programming WL2 PGM, and first word line programming WL1 PGM.

In CASE 1 of FIG. 22, the predefined word line may be the first word line WL1. In this case, after the first word line programming WL1 PGM is completed, the nonvolatile memory device 220 may perform an erase operation CWL1/CWL2 ERS on the first and second junction word lines CWL1 and CWL2. The first word line WL1 may indicate a word line of a memory block, to which a program operation is lastly applied.

In CASE 2 of FIG. 22, the predefined word line may be the fifth word line WL5. In this case, after the fifth word line programming WL5 PGM is completed, the nonvolatile memory device 220 may perform the erase operation CWL1/CWL2 ERS on the first and second junction word lines CWL1 and CWL2. The fifth word line WL5 may indicate a word line adjacent to a junction word line.

CASE 1 and CASE 2 described above are simple examples, and the present disclosure is not limited thereto. The predefined word line may be determined in various manners, and one memory block may include one or more predefined word lines.

Although not illustrated in FIGS. 21 and 22, in the case where the first programming (i.e., the eighth word line programming WL8 PGM) is performed at a selected memory block, the nonvolatile memory device 220 may first perform an erase operation on the selected memory block and may then perform the eighth word line programming WL8 PGM. In this case, the nonvolatile memory device 220 may perform the erase operation based on the variable mode as described above.

Figure 23:
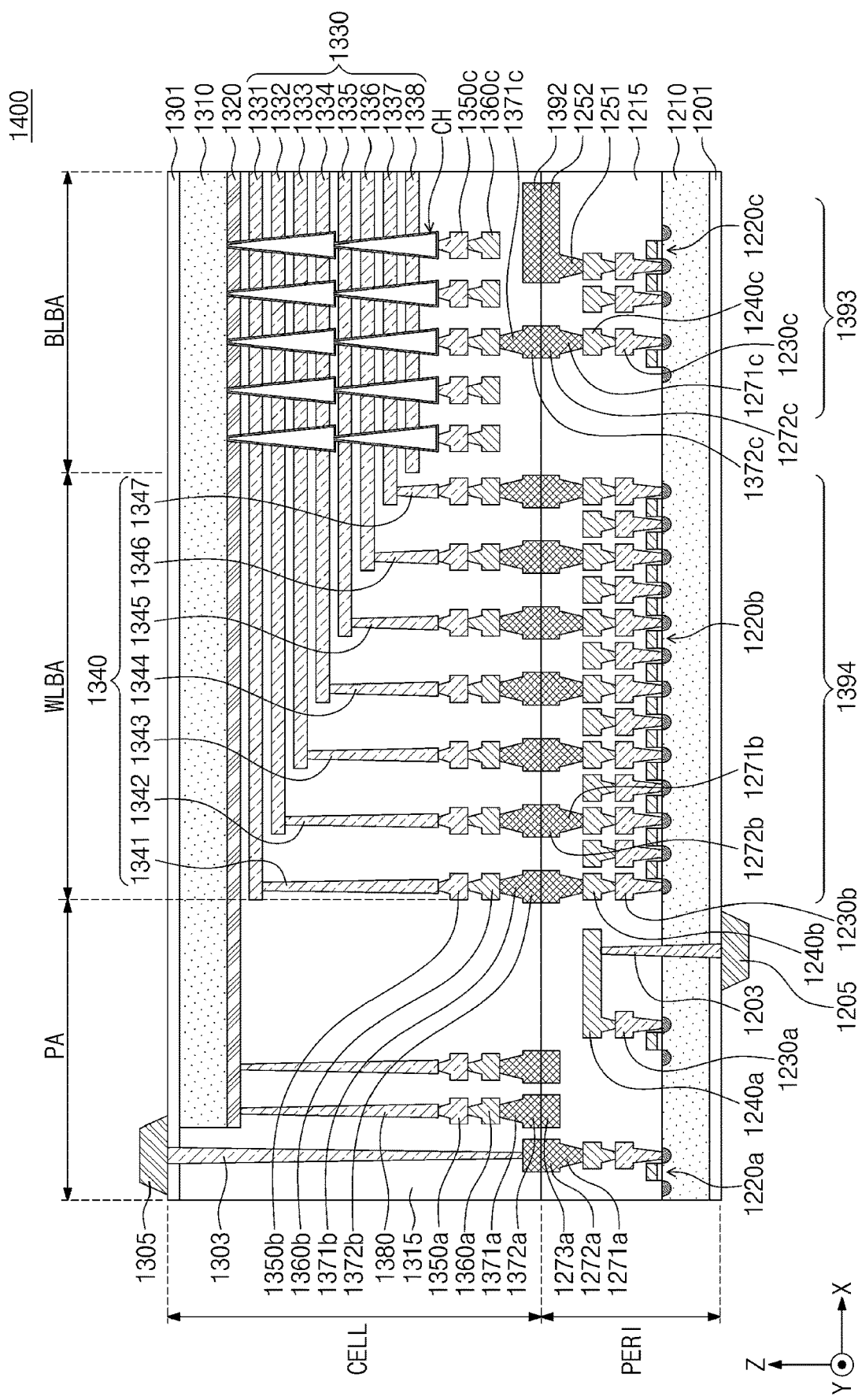
FIG. 23 is a cross-sectional view of a memory device according to example embodiments of the present disclosure.

FIG. 23 is a cross-sectional view of a memory device according to example embodiments of the present disclosure. Referring to FIG. 23, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, the bonding metal may include a copper (Cu) for Cu-to-Cu bonding. However, an embodiment is not limited thereto. For example, the bonding metal may be formed of aluminum (Al) or tungsten (W).

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. Each of the circuit elements 1220a, 1220b, and 1220c may include one or more transistors. In an embodiment, the first metal layers 1230a, 1230b, and 1230c may be formed of tungsten having a relatively high resistance, and the second metal layers 1240a, 1240b, and 1240c may be formed of copper having a relatively low resistance.

In an embodiment illustrate in FIG. 23, even though the first metal layers 1230a, 1230b, and 1230c and the second metal layers 1240a, 1240b, and 1240c are shown and described, the first metal layers 1230a, 1230b, and 1230c and the second metal layers 1240a, 1240b, and 1240c are not limited thereto, and one or more metal layers may be further formed on the second metal layers 1240a, 1240b, and 1240c. At least a part of the one or more metal layers formed on the second metal layers 1240a, 1240b, and 1240c may be formed of aluminum or the like having a lower resistance than those of copper forming the second metal layers 1240a, 1240b, and 1240c.

The interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a bonding manner. The lower bonding metals 1271b and 1272b and the upper bonding metals 1371b and 1372b may be formed of aluminum, copper, tungsten, or the like.

Also, the upper bonding metals 1371b and 1372b in the cell region CELL may be referred as "first metal pads", and the lower bonding metals 1271b and 1272b in the peripheral circuit region PERI may be referred as "second metal pads". The first metal pads and the second metal pads may be connected to each other in a bonding manner.

The cell region CELL may include at least one memory block. The cell region CELL may include a second substrate 1310, an interlayer insulating layer 1315, and a common source line 1320. On the second substrate 1310, a plurality of word lines 1331 to 1338 (i.e., 1330) may be stacked in a direction (i.e., a Z-axis direction) perpendicular to an upper surface of the second substrate 1310. String selection lines and a ground selection line may be arranged on and below the plurality of word lines 1330, respectively, and the plurality of word lines 1330 may be disposed between the string selection lines and the ground selection line.

Widths of the plurality of word lines 1330 in the X-axis direction may be different. As a distance from the first substrate 1210 of the peripheral circuit region PERI to the corresponding one of the plurality of word lines 1330 increases, a width of the corresponding one of the plurality of word lines 1330 increases. Likewise, as a distance from the second substrate 1310 of the cell region CELL to the corresponding one of the plurality of word lines 1330 increases, a width of the corresponding one of the plurality of word lines 1330 decreases.

In the bit line bonding area BLBA, a channel structure CH may extend in a direction perpendicular to the upper surface of the second substrate 1310 and may pass through the plurality of word lines 1330, the string selection lines, and the ground selection line. The channel structure CH may include a data storage layer, a channel layer, a buried insulating layer, and the like, and the channel layer may be electrically connected to a first metal layer 1350c and a second metal layer 1360c. The data storage layer, the channel layer and the buried insulating layer of the channel structure CH may be formed in a channel hole. In an example embodiment, the first metal layer 1350c may be a bit line contact, and the second metal layer 1360c may be a bit line. In an embodiment, the bit line 1360c may extend in a first direction (i.e., a Y-axis direction) parallel to the upper surface of the second substrate 1310.

The interlayer insulating layer 1315 may be disposed on the second substrate 1310 to cover the common source line 1320, the plurality of word lines 1330, a plurality of cell contact plugs 1340, first metal layers 1350a, 1350b, and 1350c, and second metal layers 1360a, 1360b, and 1360c. The interlayer insulating layer 1315 may include an insulating material such as silicon oxide, silicon nitride, or the like.

In an embodiment illustrated in FIG. 23, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. For example, the bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393. The page buffer 1393 may be included in the input/output circuit 140 of FIG. 1.

In the word line bonding area WLBA, the plurality of word lines 1330 may extend in a second direction (i.e., an X-axis direction) perpendicular to the first direction and parallel to the upper surface of the second substrate 1310 and may be connected to a plurality of cell contact plugs 1341 to 1347 (i.e., 1340). The word lines 1330 and the cell contact plugs 1340 may be connected to each other at pads provided by at least some of the plurality of word lines 1330, which extend in the second direction with different lengths. The first metal layer 1350b and the second metal layer 1360b may be sequentially connected to an upper portion of each of the cell contact plugs 1340 connected to the word lines 1330. The cell contact plugs 1340 may be connected to the peripheral circuit region PERI by the upper bonding metals 1371b and 1372b of the cell region CELL and the lower bonding metals 1271b and 1272b of the peripheral circuit region PERI in the word line bonding area WLBA.

The cell contact plugs 1340 may be electrically connected to the circuit elements 1220b providing a row decoder 1394 in the peripheral circuit region PERI. The row decoder 1394 may correspond to the address decoder 120 of FIG. 1. In an embodiment, operating voltages of the circuit elements 1220b constituting the row decoder 1394 may be different from operating voltages of the circuit elements 1220c constituting the page buffer 1393. For example, operating voltages of the circuit elements 1220c constituting the page buffer 1393 may be greater than operating voltages of the circuit elements 1220b constituting the row decoder 1394.

A common source line contact plug 1380 may be disposed in the external pad bonding area PA. The common source line contact plug 1380 may be formed of a conductive material such as a metal, a metal compound, polysilicon, or the like and may be electrically connected to the common source line 1320. The first metal layer 1350a and the second metal layer 1360a may be sequentially stacked on an upper portion of the common source line contact plug 1380. For example, an area in which the common source line contact plug 1380, the first metal layer 1350a, and the second metal layer 1360a are disposed may be defined as the external pad bonding area PA.

Meanwhile, input/output pads 1205 and 1305 may be disposed in the external pad bonding area PA. Referring to FIG. 23, a lower insulating film 1201 covering a lower surface of the first substrate 1210 may be formed below the first substrate 1210, and the first input/output pad 1205 may be formed on the lower insulating film 1201. The first input/output pad 1205 may be connected to at least one of the plurality of circuit elements 1220a, 1220b, and 1220c disposed in the peripheral circuit region PERI through a first input/output contact plug 1203 and may be separated from the first substrate 1210 by the lower insulating film 1201. In addition, a side insulating film may be disposed between the first input/output contact plug 1203 and the first substrate 1210 to electrically separate the first input/output contact plug 1203 and the first substrate 1210.

Referring to FIG. 23, an upper insulating film 1301 covering the upper surface of the second substrate 1310 may be formed on the second substrate 1310, and the second input/output pad 1305 may be disposed on the upper insulating layer 1301. The second input/output pad 1305 may be connected to at least one of the plurality of circuit elements 1220a, 1220b, and 1220c disposed in the peripheral circuit region PERI through a second input/output contact plug 1303 and the lower bonding metals 1271a and 1272a of the peripheral circuit region PERI. In an embodiment, the second input/output pad 1305 may be electrically connected to the circuit element 1220a.

According to embodiments, the second substrate 1310 and the common source line 1320 may not be disposed in an area in which the second input/output contact plug 1303 is disposed. Also, the second input/output pad 1305 may not overlap the word lines 1330 in a third direction (i.e., a Z-axis direction). Referring to FIG. 23, the second input/output contact plug 1303 may be separated from the second substrate 1310 in a direction parallel to the upper surface of the second substrate 1310 and may pass through the interlayer insulating layer 1315 and the upper insulating film 1301 of the cell region CELL to be connected to the second input/output pad 1305 and an upper metal pattern 1372a of the cell region CELL.

According to embodiments, the first input/output pad 1205 and the second input/output pad 1305 may be selectively formed. For example, the memory device 1400 may include only the first input/output pad 1205 disposed on the lower insulating film 1201 in contact with the first substrate 1210 or the second input/output pad 1305 disposed on the upper insulating film 1301 in contact with the second substrate 1310. Alternatively, the memory device 1400 may include both the first input/output pad 1205 and the second input/output pad 1305.

In each of the external pad bonding area PA and the bit line bonding area BLBA respectively included in the cell region CELL and the peripheral circuit region PERI, a metal pattern in an uppermost metal layer may be provided as a dummy pattern, or the uppermost metal layer may be absent.

In the external pad bonding area PA, the memory device 1400 may include a lower metal pattern 1273a, which corresponds to an upper metal pattern 1372a formed in an uppermost metal layer of the cell region CELL and has the same shape as the upper metal pattern 1372a of the cell region CELL, in an uppermost metal layer of the peripheral circuit region PERI. In the peripheral circuit region PERI, the lower metal pattern 1273a formed in the uppermost metal layer of the peripheral circuit region PERI may not be connected to a contact. As in the above description, in the external pad bonding area PA, the upper metal pattern 1372a that corresponds to the lower metal pattern 1273a formed in the uppermost metal layer of the peripheral circuit region PERI and has the same shape as the lower metal pattern 1273a of the peripheral circuit region PERI, may be formed in the uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu—Cu bonding manner.

Also, in the bit line bonding area BLBA, an upper metal pattern 1392 that corresponds to a lower metal pattern 1252 formed in the uppermost metal layer of the peripheral circuit region PERI and has the same shape as the lower metal pattern 1252 of the peripheral circuit region PERI may be formed in the uppermost metal layer of the cell region CELL. A contact may not be formed on the upper metal pattern 1392 formed in the uppermost metal layer of the cell region CELL.

In an embodiment, a reinforce metal pattern that corresponds to a metal pattern formed in the uppermost metal layer of one of the cell region CELL and the peripheral circuit region PERI and has the same shape as the metal pattern may be formed in the uppermost metal layer of the other of the cell region CELL and the peripheral circuit region PERI. A contact pattern may not be formed on the reinforce metal pattern.

In an embodiment, the memory device 1400 of FIG. 23 may be one of the nonvolatile memory devices 100 and 220 described with reference to FIGS. 1 to 15, 16A to 16C, and 17 to 22. For example, the memory device 1400 may perform an erase operation based on the operation method described with reference to FIGS. 1 to 15, 16A to 16C, and 17 to 22. In an example embodiment, the cell region CELL may correspond to the memory cell array 110 in FIG. 1. In an example embodiment, the peripheral circuit region PERI may correspond to at least one of the address decoder 120, the voltage generator 130, the input/output circuit 140, and the control logic circuit 150 in FIG. 1.

Figure 24:
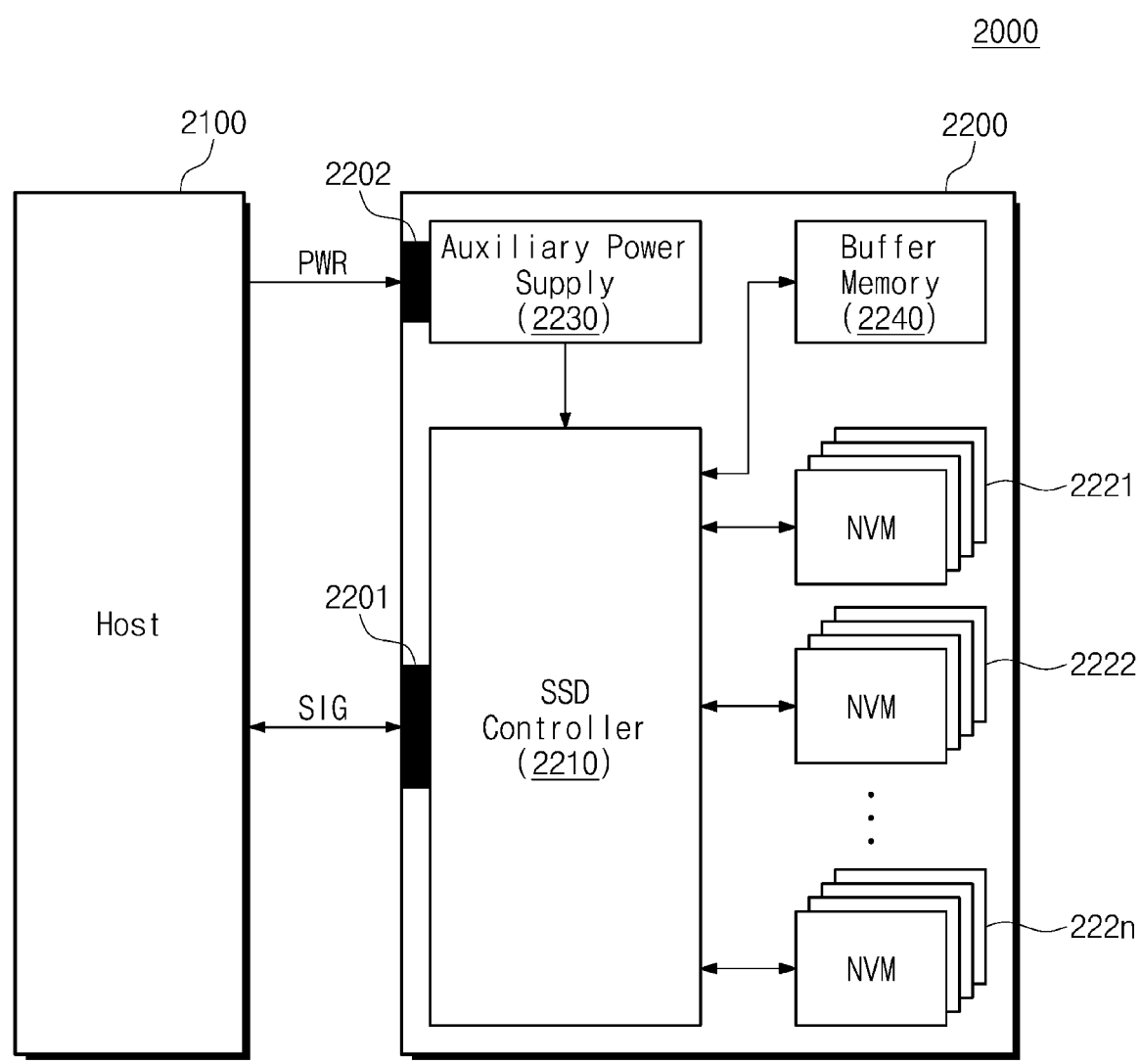
FIG. 24 is a block diagram illustrating a solid state drive (SSD) system to which a nonvolatile memory device according to the present disclosure is applied.

FIG. 24 is a block diagram illustrating a solid state drive (SSD) system to which a nonvolatile memory device according to the present disclosure is applied. Referring to FIG. 24, an SSD system 2000 may include a host 2100 and a storage device 2200. The storage device 2200 may exchange signals SIG with the host 2100 through a signal connector 2201 and may be supplied with a power PWR through a power connector 2202. The storage device 2200 includes an SSD controller 2210, a plurality of nonvolatile memories 2221 to 222n, an auxiliary power supply 2230, and a buffer memory 2240.

The SSD controller 2210 may control the plurality of nonvolatile memories 2221 to 222n in response to the signals SIG received from the host 2100. The plurality of nonvolatile memories 2221 to 222n may operate under control of the SSD controller 2210. The auxiliary power supply 2230 is connected to the host 2100 through the power connector 2202. The auxiliary power supply 2230 may be charged by the power PWR supplied from the host 2100. When the power PWR is not smoothly supplied from the host 2100, the auxiliary power supply 2230 may power the SSD 2200. The buffer memory 2240 may be used as a buffer memory of the storage device 2200.

In an embodiment, each of the plurality of nonvolatile memories 2221 to 222n may be configured to perform the erase operation described with reference to FIGS. 1 to 15, 16A to 16C, and 17 to 23. Alternatively, the SSD controller 2210 may allow the plurality of nonvolatile memories 2221 to 222n to perform the erase operation described with reference to FIGS. 1 to 15, 16A to 16C, and 17 to 23.

According to the present disclosure, a nonvolatile memory device may include a multi-stacked memory block. The nonvolatile memory device may prevent a read error due to a change in threshold voltages of memory cells connected to junction word lines placed at the junction portion of stacked memory structures by performing an erase operation on the junction word lines (i.e., by performing the erase operation on the memory cells connected to the junction word lines). Accordingly, an erase method of a nonvolatile memory device with improved reliability and an operation method of a storage device are provided.

While the present disclosure has been described with reference to exemplary embodiments thereof, it will be apparent to those of ordinary skill in the art that various changes and modifications may be made thereto without departing from the spirit and scope of the present disclosure as set forth in the following claims.

What is claimed is:

1. An erase method of a nonvolatile memory device which includes a memory block including a first structure formed on a substrate and a second structure formed on the first structure, the first structure including a plurality of first word lines connected to first normal cells and a first junction memory cell, and the second structure including a plurality of second word lines connected to second normal cells and a second junction memory cell, the method comprising:
applying a word line erase voltage to first normal word lines of the plurality of first word lines connected to the first normal cells of the first structure and second normal word lines of the plurality of second word lines connected to the second normal cells of the second structure during a word line setup phase; and
applying a junction word line erase voltage smaller than the word line erase voltage to at least one of a first junction word line of the plurality of first word lines connected to the first junction memory cell of the first structure and a second junction word line of the plurality of second word lines connected to the second junction memory cell of the second structure during the word line setup phase,
wherein the first junction word line is a word line adjacent to the second structure from among the plurality of first word lines, and the second junction word line is a word line adjacent to the first structure from among the plurality of second word lines.

2. The method of claim 1, wherein the first structure further includes a first channel passing through the first normal word lines and the first junction word line, and
wherein the second structure further includes a second channel passing through the second normal word lines and the second junction word line.

3. The method of claim 2, wherein a diameter of the first channel passing through the first junction word line is greater than a diameter of the second channel passing through the second junction word line.

4. The method of claim 1, wherein a distance between the first junction word line and the second junction word line is greater than a distance between adjacent normal word lines of the first normal word lines or a distance between adjacent normal word lines of the second normal word lines.

5. The method of claim 1, further comprising:
applying a first voltage to a first dummy word line interposed between the first normal word lines and the first junction word line during the word line setup phase; and
applying the first voltage to a second dummy word line interposed between the second normal word lines and the second junction word line during the word line setup phase.

6. The method of claim 1, further comprising, during the word line setup phase:
applying an erase voltage to a common source line connected to the first structure; and
applying a first voltage smaller than the erase voltage to one or more ground selection lines respectively connected to one or more ground selection transistors, the one or more ground selection lines interposed between the first normal word lines and the substrate.

7. The method of claim 6, further comprising:
applying the first voltage to a dummy word line interposed between the first normal word lines and the one or more ground selection lines during the word line setup phase.

8. The method of claim 1, further comprising, during the word line setup phase:
applying an erase voltage to a bit line connected to the second structure; and
applying a first voltage smaller than the erase voltage to one or more string selection lines respectively connected to one or more string selection transistors, the one or more string selection lines interposed between the second normal word lines and the bit line.

9. The method of claim 8, further comprising:
applying the first voltage to a dummy word line interposed between the one or more string selection lines and the second normal word lines during the word line setup phase.

10. The method of claim 1, further comprising:
when the junction word line erase voltage is applied to one of the first junction word line and the second junction word line, applying an erase inhibit voltage greater than the junction word line erase voltage to the other of the first junction word line and the second junction word line.

11. The method of claim 1, further comprising:
maintaining voltages of the first normal word lines and the second normal word lines at the word line erase voltage during an erase phase following the word line setup phase; and
changing a level of the junction word line erase voltage during the erase phase.

12. The method of claim 11, further comprising:
performing an erase verification operation on the memory block after the erase phase,
wherein the performing of the erase verification operation includes:
applying an erase verification voltage to the first normal word lines and the second normal word lines, and
applying a junction verification voltage greater than the erase verification voltage to the first junction word line and the second junction word line.

13. An erase method of a nonvolatile memory device which includes a memory block including a first structure formed on a substrate and a second structure formed on the first structure, the first structure including a plurality of first word lines connected to first normal cells and a first junction memory cell, and the second structure including a plurality of second word lines connected to second normal cells and a second junction memory cell, the method comprising:
applying an erase voltage to a common source line connected to the first structure during a word line setup phase;
applying a junction word line erase voltage smaller than the erase voltage to at least one of a first junction word line of the plurality of first word lines connected to the first junction memory cell of the first structure and a second junction word line of the plurality of second word lines connected to the second junction memory cell of the second structure during the word line setup phase; and
increasing the junction word line erase voltage to a first voltage and applying the increased voltage to the at least one of the first junction word line and the second junction word line during an erase phase following the word line setup phase,
wherein the first junction word line is a word line adjacent to the second structure from among the plurality of first word lines, and the second junction word line is a word line adjacent to the first structure from among the plurality of second word lines.

14. The method of claim 13, further comprising:
applying a word line erase voltage greater than the junction word line erase voltage and smaller than the first voltage to first normal word lines of the plurality of first word lines and second normal word lines of the plurality of second word lines during the word line setup phase.

15. The method of claim 13, further comprising:
applying the first voltage to a plurality of first normal word lines of the first structure and a plurality of second normal word lines of the second structure during the word line setup phase.

16. An operation method of a storage device which includes a nonvolatile memory device and a memory controller, the nonvolatile memory device including a memory block which includes a first structure formed on a substrate and a second structure formed on the first structure, the first structure including a plurality of first word lines connected to first normal cells and a first junction memory cell, and the second structure including a plurality of second word lines connected to second normal cells and a second junction memory cell, the method comprising:
transmitting, at the memory controller, a first command and a first address to the nonvolatile memory device;
performing, at the nonvolatile memory device, a first read operation on a memory block corresponding to the first address in response to the first command to output a first counting value;
when the first counting value is greater than a reference value, transmitting, at the memory controller, a first erase command and the first address to the nonvolatile memory device; and
performing, at the nonvolatile memory device, a first erase operation on the memory block corresponding to the first address in response to the first erase command,
wherein the first erase operation includes:
applying a word line erase voltage to first normal word lines of the plurality of first word lines connected to the first normal cells of the first structure and second normal word lines of the plurality of second word lines connected to the second normal cells of the second structure during a word line setup phase; and applying a junction word line erase voltage smaller than the word line erase voltage to at least one of a first junction word line of the plurality of first word lines connected to the first junction memory cell of the first structure and a second junction word line of the plurality of second word lines connected to the second junction memory cell of the second structure during the word line setup phase, wherein the first junction word line is a word line adjacent to the second structure from among the plurality of first word lines, and the second junction word line is a word line adjacent to the first structure from among the plurality of second word lines.

17. The method of claim 16, wherein the first read operation performed on the memory block is a read operation associated with the first junction word line and the second junction word line.

18. The method of claim 17, further comprising:

when the first counting value is not greater than the reference value, transmitting, at the memory controller, a second erase command and the first address to the nonvolatile memory device; and performing, at the nonvolatile memory device, a second erase operation on the memory block in response to the second erase command, wherein the second erase operation includes:

applying the word line erase voltage to the first normal word lines and the second normal word lines during the word line setup phase; and applying an erase inhibit voltage greater than the word line erase voltage to the first junction word line and the second junction word line during the word line setup phase.

19. The method of claim 17, further comprising:

when a number of program/erase cycles of the memory block reaches a reference range, transmitting, at the memory controller, the first erase command and the first address to the nonvolatile memory device.

20. The method of claim 14, further comprising:

applying the erase voltage to a bit line connected to the second structure during the word line setup phase;

applying a second voltage equal to or greater than the word line erase voltage to a string selection line connected to a string selection transistor which is connected to the bit line during the word line setup phase; and applying the second voltage to a ground selection line connected to a ground selection transistor which is connected to the common source line during the word line setup phase.

* * * * *